(12) United States Patent
Kuramoto et al.

(10) Patent No.: US 9,025,631 B2
(45) Date of Patent: May 5, 2015

(54) LIGHT-EMITTING DEVICE AND METHOD OF MANUFACTURING THE SAME

(75) Inventors: Masaru Kuramoto, Kanagawa (JP); Rintaro Koda, Tokyo (JP); Hideki Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/345,289

(22) PCT Filed: Sep. 4, 2012

(86) PCT No.: PCT/JP2012/072448
§ 371 (c)(1),
(2), (4) Date: Mar. 17, 2014

(87) PCT Pub. No.: WO2013/047107
PCT Pub. Date: Apr. 4, 2013

(65) Prior Publication Data
US 2015/0043603 A1 Feb. 12, 2015

(30) Foreign Application Priority Data
Sep. 27, 2011 (JP) .................. 2011-210354

(51) Int. Cl.
| | |
|---|---|
| H01S 5/00 | (2006.01) |
| H01S 5/22 | (2006.01) |
| H01S 5/50 | (2006.01) |
| H01S 5/343 | (2006.01) |
| H01S 5/20 | (2006.01) |
| H01S 5/32 | (2006.01) |

(52) U.S. Cl.
CPC ... *H01S 5/22* (2013.01); *H01S 5/50* (2013.01); *H01S 5/34333* (2013.01); *H01S 5/2031* (2013.01); *H01S 5/3213* (2013.01)

(58) Field of Classification Search
USPC .................. 372/45.01, 34.01, 46.012
See application file for complete search history.

(56) References Cited

U.S. PATENT DOCUMENTS

| | | | |
|---|---|---|---|
| 6,618,411 B1 * | 9/2003 | Takiguchi et al. | 372/45.01 |
| 6,618,416 B1 | 9/2003 | Taneya et al. | |
| 7,164,701 B2 * | 1/2007 | Tanaka et al. | 372/45.01 |
| 2010/0290496 A1 * | 11/2010 | Takayama et al. | 372/46.012 |

FOREIGN PATENT DOCUMENTS

| | | |
|---|---|---|
| JP | HEI 05-067845 | 3/1993 |
| JP | 09-129974 | 5/1997 |
| JP | 2000-312051 | 11/2000 |
| WO | 00/21169 | 4/2000 |

* cited by examiner

*Primary Examiner* — Kinam Park
(74) *Attorney, Agent, or Firm* — K&L Gates LLP

(57) ABSTRACT

Provided is a high-output light-emitting device capable of emitting a light beam in a single mode. The light-emitting device includes a laminate structure body configured by laminating, in order, a first compound semiconductor layer, an active layer, and a second compound semiconductor layer on a base substrate, a second electrode, and a first electrode. The first compound semiconductor layer has a laminate structure including a first cladding layer and a first light guide layer in order from the base substrate, and the laminate structure body has a ridge stripe structure configured of the second compound semiconductor layer, the active layer, and a portion in a thickness direction of the first light guide layer. Provided that a thickness of the first light guide layer is $t_1$, and a thickness of the portion configuring the ridge stripe structure of the first light guide layer is $t_1'$, $6\times10^{-7}$ m$<t_1$ and $0(m)< t_1' \leq 0.5 \cdot t_1$ are satisfied.

17 Claims, 14 Drawing Sheets

(A) [STEP-110] (CONTINUED)

(B) [STEP-110] (CONTINUED)

(A) [STEP-200]

(B) [STEP-210]

(C) [STEP-230]

(A) [STEP-300]

(B) [STEP-310]

(A) [STEP-320]

(B) [STEP-330]

LIGHT-EMITTING DEVICE AND METHOD OF MANUFACTURING THE SAME

CROSS REFERENCES TO RELATED APPLICATIONS

The present application is a national stage of International Application No. PCT/JP2012/072448 filed on Sep. 4, 2012 and claims priority to Japanese Patent Application No. 2011-210354 filed on Sep. 27, 2011, the disclosure of which is incorporated herein by reference.

BACKGROUND

The present disclosure relates to a light-emitting device and a method of manufacturing the same.

In laser light sources, power enhancement is a major task. Therefore, in addition to output enhancement in laser diode devices, semiconductor optical amplifiers (SOA) have been diligently studied as devices that amplify light from a laser light source. As used herein, optical amplifiers refer to amplifiers that directly amplify an optical signal in the form of light without converting the optical signal into an electrical signal, and the optical amplifiers have a laser structure without resonator, and amplify incident light with an optical gain thereof.

Since optical amplifiers have been developed mainly for optical communication, semiconductor optical amplifiers for a 405-nm band have rarely been put to practical use. A semiconductor optical amplifier for a 1.5-μm band that uses a GaInAsP-based compound semiconductor and has a tapered ridge stripe structure is known from, for example, Japanese Unexamined Patent Application Publication No. H5-067845. According to the technology disclosed in this patent publication, in the semiconductor optical amplifier, a mode field is expanded along an optical waveguide width by gradually widening the optical waveguide width in a tapered shape from a narrow optical waveguide satisfying single-mode conditions on an input side to an optical waveguide on an output side so as to enhance highest output in the semiconductor optical amplifier.

A typical laser diode device or a typical semiconductor optical amplifier has a laminate structure body formed on a base substrate. In this case, a typical laminate structure body is configured by laminating, in order from the base substrate, n-type compound semiconductor layers (specifically, an n-type cladding layer and an n-type light guide layer) doped with n-type impurities, an active layer, and p-type compound semiconductor layers (specifically, a p-type light guide layer and a p-type cladding layer) doped with p-type impurities.

CITATION LIST

Patent Literature

[PTL 1] Japanese Unexamined Patent Application Publication No. H5-067845

SUMMARY

One of methods of achieving output enhancement in a laser diode device and a semiconductor optical amplifier is to reduce an optical confinement factor. To reduce the optical confinement factor, as illustrated in FIG. 13(A), a thickness of the n-type light guide layer made of an n-type compound semiconductor may be increased, and a peak of a light field intensity distribution is thereby moved from the active layer to the n-type light guide layer. As a result, the optical confinement factor is allowed to be reduced, and light density around the active layer is allowed to be reduced in a high-output operation; therefore, optical damage is allowed to be prevented, and specifically in the semiconductor optical amplifier, saturation energy of amplified light is allowed to be increased, thereby achieving output enhancement. It is to be noted that, in FIG. 13(A), a horizontal axis represents the thickness (unit: nm) of the n-type light guide layer and a vertical axis represents the optical confinement factor. However, the inventors of the present invention have proved by their research that, when the thickness of the n-type light guide layer is greater than 0.6 μm, the mode of a light beam emitted from the laser diode device or the semiconductor optical amplifier is not a single mode, as illustrated in FIG. 13(B). It is to be noted that, in FIG. 13(B), a horizontal axis represents the thickness (unit: nm) of the n-type light guide layer, and a vertical axis represents a full width at half maximum (FWHM) of a far-field pattern (FFP) of which a unit is "deg". Moreover, as can be seen from FIG. 14 illustrating a near-field pattern, a light beam is not in the single mode but in a multi-beam shape. The light beam is not in the single mode when the thickness of the n-type compound semiconductor layer is greater than 0.6 μm, because it is considered that cutoff conditions of the single mode in a thickness direction of the compound semiconductor layer are not satisfied. Moreover, when the light beam is not in the single mode, an issue such as deterioration in light condensing characteristics may be caused in applications when a lens or an optical fiber is used.

Therefore, it is desirable to provide a light-emitting device capable of emitting a light beam in the single mode, such as a high-output laser diode device or a high-output semiconductor optical amplifier, and a method of manufacturing the same.

A light-emitting device according to an embodiment of the present disclosure includes:

a laminate structure body configured by laminating, in order, a first compound semiconductor layer of a first conductivity type, an active layer made of a compound semiconductor, and a second compound semiconductor layer of a second conductivity type different from the first conductivity type on a base substrate;

a second electrode formed on the second compound semiconductor layer; and a first electrode configured to be electrically connected to the first compound semiconductor layer, in which the first compound semiconductor layer has a laminate structure including a first cladding layer and a first light guide layer in order from the base substrate, the laminate structure body has a ridge stripe structure configured of the second compound semiconductor layer, the active layer, and a portion in a thickness direction of the first light guide layer, and $6 \times 10^{-7}$ m$<t_1$, preferably $8 \times 10^{-7}$ m$\le t_1$, and $0(m)<t_1' \le 0.5 \cdot t_1$, preferably $0(m)<t_1' \le 0.3 \cdot t_1$ are satisfied, where a thickness of the first light guide layer is $t_1$, and a thickness of the portion configuring the ridge stripe structure of the first light guide layer is $t_1'$.

Moreover, it may be preferable to satisfy a relationship of $0.2 \times W < t_1 < 1.2 \times W$, preferably $0.2 \times W < t_1 \le W$, where a width of the ridge stripe structure (for example, a width of the ridge stripe structure in a light-exit end surface) is W. This is also applicable to the following embodiments.

A first method of manufacturing a light-emitting device according to an embodiment of the present disclosure, the method including steps of:

after forming a laminate structure body configured by laminating, in order, a first compound semiconductor layer of a first conductivity type, an active layer made of a compound semiconductor, and a second compound semiconductor layer of a second conductivity type different from the first conductivity type on a base substrate, etching the second compound semiconductor layer and the active layer by a dry etching method, and further etching a portion of the first compound semiconductor layer along a thickness direction by the dry etching method to form a ridge stripe structure; and after that, immersing an etched portion in an acid solution or an alkali solution, in which the first compound semiconductor layer has a laminate structure including a first cladding layer and a first light guide layer in order from the base substrate, the ridge stripe structure is configured of the second compound semiconductor layer, the active layer, and a portion in the thickness direction of the first light guide layer, and $6 \times 10^{-7}$ m $< t_1$, preferably $8 \times 10^{-7}$ m $\leq t_1$, and $0(m) < t_1$, and $0(m) < t_1' \leq 0.5 \cdot t_1$, preferably $0(m) < t_1' \leq 0.3 \cdot t_1$ are satisfied, where a thickness of the first light guide layer is $t_1$, and a thickness of the portion configuring the ridge stripe structure of the first light guide layer is $t_1'$.

A second method of manufacturing a light-emitting device according to an embodiment of the present disclosure, the method including steps of:

forming, on a base substrate, two recess sections extending along an axis line direction of a light-emitting device that is supposed to be manufactured to obtain a region sandwiched between the two recess sections of the base substrate; and after that, forming a laminate structure body configured by laminating, in order, a first compound semiconductor layer of a first conductivity type, an active layer made of a compound semiconductor, and a second compound semiconductor layer of a second conductivity type different from the first conductivity type on the base substrate, in which the first compound semiconductor layer has a laminate structure including a first cladding layer and a first light guide layer in order from the base substrate, $6 \times 10^{-7}$ m $< t_1$, preferably $8 \times 10^{-7}$ m $\leq t_1$, and $(T_{Total} - 0.5 \cdot t_1) \leq D \leq T_{Total}$, preferably $(T_{Total} - 0.3 \cdot t_1) \leq D \leq T_{Total}$ are satisfied, where a thickness of the first light guide layer on the region sandwiched between the two recess sections of the base substrate is $t_1$, a total thickness of the laminate structure body is $t_{Total}$, and a depth of the recess section is D.

A third method of manufacturing a light-emitting device according to an embodiment of the present disclosure, the method including steps of:

after forming a first portion of a first compound semiconductor layer of a first conductivity type, forming a growth inhibition layer on the first portion of the first compound semiconductor layer to allow a region where a ridge stripe structure is supposed to be formed of the first portion of the first compound semiconductor layer to be exposed; and after that, forming a laminate structure body configured by laminating, in order, a second portion of the first compound semiconductor layer, an active layer made of a compound semiconductor, and a second compound semiconductor layer of a second conductivity type different from the first conductivity type on a region exposed from a bottom of an opening of the first portion of the first compound semiconductor layer, in which the first portion of the first compound semiconductor layer has a laminate structure including a first cladding layer and a first portion of a first light guide layer in order from the base substrate, and a second portion of the first compound semiconductor layer is configured of a second portion of the first light guide layer, and $6 \times 10^{-7}$ m $< t_1$, preferably $8 \times 10^{-7}$, and $0(m) < t_1' \leq 0.5 \cdot t_1$, preferably $0(m) < t_1' \leq 0.3 \cdot t_1$ are satisfied, where a total of thicknesses of the first portion of the first light guide layer and the second portion of the first light guide layer is $t_1$, and a thickness of the second portion of the first light guide layer is $t_1'$.

In the light-emitting device according to the embodiment of the present disclosure, or the first method of manufacturing the light-emitting device according to the embodiment of the present disclosure, the thickness $t_1$ of the first light guide layer is determined, in the second method of manufacturing the light-emitting device according to the embodiment of the present disclosure, the thickness $t_1$ of the first light guide layer on the region sandwiched between the two recess sections of the base substrate is determined, and in the third method of manufacturing the light-emitting device according to the embodiment of the present disclosure, the total $t_1$ of the thicknesses of the first portion and the second portion of the first light guide layer is determined.

Therefore, an optical confinement factor is allowed to be reduced, and a peak of an optical field intensity distribution is moved from the active layer to the first light guide layer, and as a result, light density around the active layer is allowed to be reduced during a high-output operation, and in addition to prevention of optical damage, specifically in a semiconductor optical amplifier, an increase in saturation energy of amplified light and output enhancement are allowed to be achieved.

Moreover, in the light-emitting device according to the embodiment of the present disclosure or the first method of manufacturing the light-emitting device according to the embodiment of the present disclosure, the thickness $t_1'$ of the portion configuring the ridge stripe structure of the first light guide layer is determined, in the second method of manufacturing the light-emitting device according to the embodiment of the present disclosure, the depth D of the recess section is determined, and in the third method of manufacturing the light-emitting device according to the embodiment of the present disclosure, the thickness $t_1'$ of the second portion of the first light guide layer is determined.

Therefore, the mode of a light beam to be emitted is allowed to be a single mode. Further, since a width of a slab waveguide and a thickness of the first light guide layer are substantially equal to each other, the light beam is allowed to have a sectional shape close to a perfect circle, and adverse effects such as deterioration in condensing characteristics are not caused in applications using a lens or an optical fiber.

Further, in the first method of manufacturing the light-emitting device according to the embodiment of the present disclosure, since the second compound semiconductor layer, the active layer, and the first compound semiconductor layer are etched by the dry etching method, etching damage to these compound semiconductor layers may be caused; however, the etching damage is allowed to be removed by immersing the etched portion in an acid solution or an alkali solution, and the laminate structure body with high quality and high reliability is allowed to be obtained accordingly.

Additional features and advantages are described herein, and will be apparent from the following Detailed Description and the figures.

DETAILED DESCRIPTION

Figure 1:
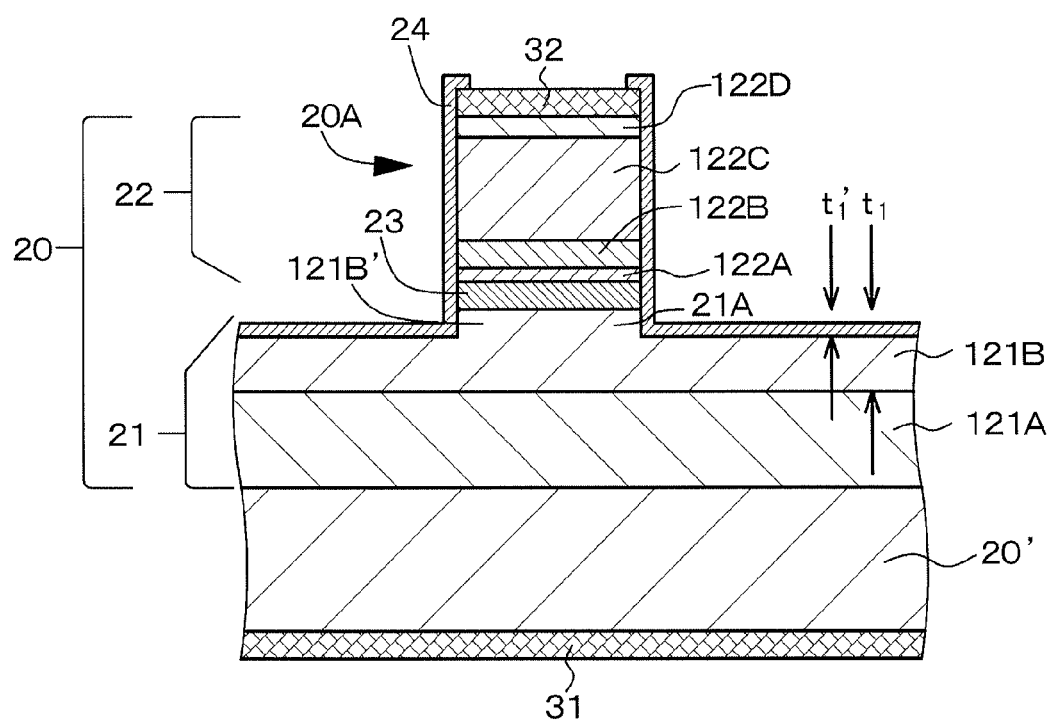
FIG. 1 is a schematic partial sectional view of a light-emitting device of Example 1 taken along a virtual plane perpendicular to an axis line of the light-emitting device.

The present disclosure will be described below, based on examples referring to the accompanying drawings; however, the present disclosure is not limited to the examples, and various numerical values and materials in the examples are merely examples. It is to be noted that description will be given in the following order.
1. General description of light-emitting device according to the present disclosure, methods of manufacturing light-emitting device according to first to third embodiments of the present disclosure 2. Example 1 (Light-emitting device according to the present disclosure and first method of manufacturing light-emitting device according to the present disclosure)
3. Example 2 (Light-emitting device according to the present disclosure and second method of manufacturing light-emitting device according to the present disclosure)
4. Example 3 (Light-emitting device according to the present disclosure and third method of manufacturing light-emitting device according to the present disclosure)
5. Example 4 (Modification of any of Examples 1 to 3)
6. Example 5 (Modification of any of Examples 1 to 4), and others In a third method of manufacturing a light-emitting device according to the present disclosure, for example, a growth inhibition layer may be preferably configured of a material layer of one or more kinds selected from a group configured of $SiO_2$, $Al_2O_3$, MN, $ZrO_2$, $Ta_2O_5$, and AlGaInN.

In a light-emitting device in any of first to third methods of manufacturing a light-emitting device according to the present disclosure or a light-emitting device according to the present disclosure that has the above-described preferred mode, it may be desirable to satisfy $t_1 \leq 3 \times 10^{-6}$ m. When crystal growth is performed to allow a thickness $t_1$ of a first guide layer to be equal to or smaller than $3 \times 10^{-6}$ m, crystal growth surface morphology is not roughened, and deterioration in light emission characteristics and electrical characteristics of the light-emitting device is preventable.

Moreover, in the light-emitting device in any of the first to third methods of manufacturing the light-emitting device according to the present disclosure or the light-emitting device according to the present disclosure that has the above-described various preferred modes, the light-emitting device may be configured to emit a single-mode light beam.

Further, in the light-emitting device in any of the first to third methods of manufacturing the light-emitting device according to the present disclosure or the light-emitting device according to the present disclosure that has the above-described various preferred modes, it may be desirable to satisfy $0.2 \leq LB_Y/LB_X \leq 1.2$, preferably $0.2 \leq LB_Y/LB_X \leq 1.0$, where a dimension in a width direction of a ridge stripe structure of a light beam emitted from a light-exit end surface of a laminate structure body is $LB_X$, and a dimension in a thickness direction of the ridge stripe structure of the light beam is $LB_Y$.

Furthermore, in the light-emitting device in any of the first to third methods of manufacturing the light-emitting device according to the present disclosure or the light-emitting device according to the present disclosure that has the above-described various preferred modes, it may be desirable that a distance $Y_{CC}$ from a central point of an active layer in the laminate structure body to a central point of a light beam emitted from the laminate structure body along the thickness direction of the ridge stripe structure in the light-exit end surface of the laminate structure body satisfy $t_1' Y_{CC} \leq t_1$, preferably $t_1' \leq Y_{CC} \leq 0.5 \cdot t_1$.

Moreover, in the light-emitting device in any of the first to third methods of manufacturing the light-emitting device according to the present disclosure or the light-emitting device according to the present disclosure that has the above-described various preferred modes, a laser diode device may be configured of the light-emitting device. Alternatively, a semiconductor optical amplifier (SOA) may be configured of the light-emitting device, and in this case, the semiconductor optical amplifier may be configured to amplify light intensity of an incident light beam 20-fold or more, and then to emit the amplified light beam.

Further, in the light-emitting device in any of the first to third methods of manufacturing the light-emitting device according to the present disclosure or the light-emitting device according to the present disclosure that has the above-described various preferred modes, a high-refractive index layer made of a compound semiconductor material with a higher refractive index than a refractive index of a compound semiconductor material forming the first light guide layer may be formed in the first light guide layer.

More specifically, in these configurations, $0.01 \leq n_{HR} - n_{G-1} \leq 0.1$, preferably $0.03 \leq n_{HR} - n_{G-1} \leq 0.1$ may be satisfied, where the refractive index of the compound semiconductor material forming the first guide layer is $n_{G-1}$, the refractive index of the compound semiconductor material forming the high refractive index layer is $n_{HR}$. It is to be noted that $n_{HR} \leq n_{Ac}$ may be preferably satisfied, where an average refractive index of a compound semiconductor material forming the active layer is $n_{Ac}$.

Furthermore, in the light-emitting device in any of the first to third methods of manufacturing the light-emitting device according to the present disclosure or the light-emitting device according to the present disclosure that has the above-described various preferred modes and configurations, a second compound semiconductor layer may have a laminate structure including a second light guide layer and a second cladding layer in order from a base substrate, and the thickness of the first light guide layer may be larger than a thickness of the second light guide layer.

Moreover, in the light-emitting device in any of the first to third methods of manufacturing the light-emitting device according to the present disclosure or the light-emitting device according to the present disclosure that has the above-described various preferred modes and configurations, a first compound semiconductor layer, the active layer, and the second compound semiconductor layer may be made of a GaN-based compound semiconductor. More specifically, the laminate structure body may be made of an AlGaInN-based compound semiconductor. The high refractive index layer may be also made of an AlGaInN-based compound semiconductor. In this case, specific examples of the AlGaInN-based compound semiconductor may include GaN, AlGaN, GaInN, and AlGaInN. Moreover, these compound semiconductors may include a boron (B) atom, a thallium (Tl) atom, an arsenic (As) atom, a phosphorus (P) atom, or an antimony (Sb) atom at request. The active layer may have, for example, a quantum well structure. Specifically, the active layer may have a single quantum well structure (QW structure) or a multiple quantum well structure (MQW structure). The active layer with a quantum well structure has a structure configured by laminating one or more well layers and one or more barrier layers; however, examples of a combination of (a compound semiconductor forming the well layer, a compound semiconductor forming the barrier layer) include $(In_yGa_{(1-y)}N, GaN)$, $(In_yGa_{(1-y)}N, In_zGa_{(1-z)}N)$ [where y>z], and $(In_yGa_{(1-y)}N, AlGaN)$.

In the light-emitting device in any of the first to third methods of manufacturing the light-emitting device according to the present disclosure or the light-emitting device according to the present disclosure that has the above-described various preferred modes and configurations (hereinafter may be collectively referred to as "light-emitting device or the like according to the present disclosure"), an axis line of the light-emitting device and an axis line of the ridge stripe structure may intersect with each other at a predetermined angle. In this case, as a predetermined angle θ, 0.1 deg≤θ≤10 deg may be exemplified. The axis line of the ridge stripe structure is a straight line connecting a middle point between both ends of the ridge stripe structure in a light-exit end surfaces (also referred to as "second end surface" for the sake of convenience) to a middle point between both ends of the ridge stripe structure in an end surface (also referred to as "first end surface" for the sake of convenience) on a side opposite to the light-exit end surface (second end surface) of the laminate structure body. Further, the axis line of the light-emitting device refers to an axis line orthogonal to the first end surface and the second end surface.

Alternatively, in the light-emitting device or the like according to the present disclosure, $W_2 > W_1$ may be satisfied, where a width of the ridge stripe structure in the second end surface is $W_2$, and a width of the ridge stripe structure in the first end surface is $W_1$. It is to be noted that $W_2$ may be equal to or greater than 5 μm, and an upper limit of $W_2$ may be, for example, but not exclusively, $4 \times 10^2$ μm. Moreover, $W_1$ may be within a range from 1.4 μm to 2.0 μm both inclusive. Each end section of the ridge stripe structure may be configured of one line segment or two or more line segments. In the former case, for example, the width of the ridge stripe structure may be monotonously gradually widened in a tapered shape from the first end surface to the second end surface. On the other hand, in the latter case, for example, the width of the ridge stripe structure may be equal initially, and then be monotonously gradually widened in a tapered shape from the first end surface to the second end surface, or alternatively, for example, the width of the ridge stripe structure may be widened initially until exceeding a maximum width, and then be narrowed from the first end surface to the second end surface.

In a case where a semiconductor optical amplifier is configured of the light-emitting device or the like according to the present disclosure, a laser light source generating laser light to be incident on the semiconductor optical amplifier is configured of a mode-locked laser diode device, and pulse laser light emitted from the mode-locked laser diode device may enter the semiconductor optical amplifier, and in this case, the laser light source may be configured to emit pulse laser light, based on a mode-locking operation. The mode-locked laser diode device may be configured of the light-emitting device according to the present disclosure. However, the laser light source is not limited thereto, and well-known continuous oscillation type laser light sources, well-known pulse oscillation type laser light sources of various types and forms such as a gain switching type and a loss switching type (Q switching type), and laser light sources such as titanium sapphire lasers may be used. It is to be noted that the semiconductor optical amplifier directly amplifies an optical signal in the form of light without converting the optical signal into an electrical signal, and has a laser structure in which a resonator effect is eliminated as much as possible, and amplifies incident light with an optical gain thereof.

In a case where a semiconductor optical amplifier is configured of the light-emitting device or the like according to the present disclosure, light intensity density of laser light output from the semiconductor optical amplifier is not specifically limited, but may be 60 kilowatts or more, preferably 600 kilowatts or more per $cm^2$ of the active layer configuring the light-exit end surface. Moreover, the semiconductor optical amplifier may be configured of a transmissive type semiconductor optical amplifier, but the present disclosure is not limited thereto, and, for example, the semiconductor optical amplifier may be configured of a monolithic type semiconductor optical amplifier in which a laser diode device and a semiconductor optical amplifier are integrated.

In a case where a laser diode device is configured of the light-emitting device or the like according to the present disclosure, the laser diode device may further include an external mirror (external reflecting mirror). In other words, the laser diode device may be configured as an external resonator type laser diode device. Alternatively, the laser diode device may be configured as a monolithic type laser diode device. It is to be noted that the external resonator type laser diode device may be of a condensing type or a collimating type. In the external resonator type semiconductor laser device, light reflectivity of one end surface of the laminate structure body emitting a light beam (a light pulse) may be preferably 0.5% or less. It is to be noted that this value of light reflectivity is considerably lower than that of light reflectivity (generally within a range from 5% to 10% both inclusive) of one end surface of a laminate structure body emitting a light beam (a light pulse) in a laser diode device in related art. In an external resonator type mode-locked laser diode device, it may be desirable that a value of an external resonator length (Z', unit: μm) be $0 < Z' < 1500$, preferably $30 \leq Z' \leq 150$.

In a case where a laser diode device is configured of the light-emitting device or the like according to the present disclosure, a low-reflective coating layer may be formed at least on a second end surface. Moreover, in a case where a semiconductor optical amplifier is configured of the light-emitting device or the like according to the present disclosure, a low-reflective coating layer may be formed on the first and second end surfaces. In this case, for example, the low-reflective coating layer has a laminate structure including two or more kinds of layers selected from a group configured of a titanium oxide layer, a tantalum oxide layer, a zirconia oxide layer, a silicon oxide layer, and an aluminum oxide layer.

In the light-emitting device or the like according to the present disclosure, a second electrode is formed on the second compound semiconductor layer. In this case, the second electrode may be configured of a single palladium (Pd) layer, a single nickel (Ni) layer, a single platinum (Pt) layer, a palladium layer/platinum layer laminate structure in which the palladium layer is in contact with the second compound semiconductor layer, or a palladium layer/nickel layer laminate structure in which the palladium layer is in contact with the second compound semiconductor layer. It is to be noted that, in a case where a lower metal layer is made of palladium and an upper metal layer is made of nickel, it may be desirable that a thickness of the upper metal layer be 0.1 μm or more, preferably 0.2 μm or more. Alternatively, the second electrode may be preferably configured of a single palladium (Pd) layer, and in this case, it may be desirable that a thickness of the second electrode be preferably 20 nm or more, preferably 50 nm or more. A width of the second electrode may be appropriately determined by a width of a stripe structure.

In a case where a first conductivity type is an n-type conductivity type, a first electrode that is configured to be electrically connected to the first compound semiconductor layer of the n-type conductivity type may preferably have a single-layer structure or a multilayer structure including one or more kinds of metal selected from a group configured of gold (Au), silver (Ag), palladium (Pd), Al (aluminum), Ti (titanium), tungsten (W), Cu (copper), Zn (zinc), tin (Sn), and indium (In), and examples of such a multilayer structure may include Ti/Au, Ti/Al, and Ti/Pt/Au. The first electrode is configured to be electrically connected to the first compound semiconductor layer, and states in which the first electrode is electrically connected to the first compound semiconductor layer include a state in which the first electrode is formed on the first compound semiconductor layer, and a state in which the first electrode is connected to the first compound semiconductor layer through a conductive material layer or a conductive base substrate. For example, the first electrode and the second electrode may be formed by a PVD method such as a vacuum deposition method or a sputtering method.

A pad electrode may be disposed on the first electrode or the second electrode to be electrically connected to an external electrode or a circuit. It may be desirable that the pad electrode have a single-layer structure or a multilayer structure including one or more kinds of metal selected from a group configured of Ti (titanium), aluminum (Al), Pt (platinum), Au (gold), and Ni (nickel). Alternatively, the pad electrode may have a multilayer structure such as a Ti/Pt/Au multilayer structure or a Ti/Au multilayer structure.

Moreover, in the light-emitting device or the like according to the present disclosure, the second compound semiconductor layer may have a superlattice structure in which p-type GaN layers and p-type AlGaN layers are alternately laminated, and a thickness of the superlattice structure may be 0.7 μm or less. When such a superlattice structure is adopted, while a refractive index necessary as a cladding layer is maintained, a series resistance component of the light-emitting device is allowed to be reduced, thereby leading to reduction in an operation voltage of the light-emitting device. It is to be noted that a lower limit of the thickness of the superlattice structure may be, but not limited to, for example, 0.3 μm, and a thickness of the p-type GaN layer configuring the superlattice structure may be, for example, within a range from 1 nm to 5 nm both inclusive, and a thickness of the p-type AlGaN layer configuring the superlattice structure may be, for example, within a range from 1 nm to 5 nm both inclusive, and the total layer number of the p-type GaN layers and the p-type AlGaN layers may be within a range from 60 layers to 300 layers both inclusive. Further, a distance from the active layer to the second electrode may be 1 μm or less, preferably 0.6 μm or less. When the distance from the active layer to the second electrode is determined in such a manner, the thickness of a p-type second compound semiconductor layer with high resistance is allowed to be reduced to achieve reduction in the operation voltage of the light-emitting device. It is to be noted that the lower limit of the distance from the active layer to the second electrode may be, but not limited to, for example, 0.3 μm. Moreover, the second compound semiconductor layer is doped with $1 \times 10^{19}$ cm$^{-3}$ or more of Mg, and the absorption coefficient of the second compound semiconductor layer with respect to light with a wavelength of 405 nm from the active layer may be 50 cm$^{-1}$ or more. The atomic concentration of Mg is set on the basis of material physical properties in which the maximum hole concentration is exhibited at an atomic concentration of $2 \times 10^{19}$ cm$^{-3}$, and the atomic concentration of Mg is a result of design to achieve a maximum hole concentration, i.e., minimum resistivity of the second compound semiconductor layer. The absorption coefficient of the second compound semiconductor layer is determined to reduce the resistance of the light-emitting device as low as possible, and as a result, the absorption coefficient of light from the active layer is typically 50 cm$^{-1}$. However, the doping amount of Mg may be intentionally set to a concentration of $2 \times 10^{19}$ cm$^{-3}$ or more to increase the absorption coefficient. In this case, the upper limit of the doping amount of Mg to achieve a practical hole concentration may be, for example, $8 \times 10^{19}$ cm$^{-3}$. Further, the second compound semiconductor layer includes an undoped compound semiconductor layer and a p-type compound semiconductor layer in order from the active layer, and a distance from the active layer to the p-type compound semiconductor layer may be $1.2 \times 10^{-7}$ m or less. When the distance from the active layer to the p-type compound semiconductor layer is determined in such a manner, internal loss is allowed to be reduced without reducing internal quantum efficiency, thereby allowing a threshold current Ith at which laser oscillation starts to be reduced. It is to be noted that the lower limit of the distance from the active layer to the p-type compound semiconductor layer may be, but not limited to, for example, $5 \times 10^{-8}$ m. Moreover, a laminated insulating film configured of a SiO$_2$/Si laminate structure is formed on both side surfaces of the ridge stripe structure; and a difference in effective refractive index between the ridge stripe structure and the laminated insulating film may be within a range from $5 \times 10^{-3}$ to $1 \times 10^{-2}$ both inclusive. When such a laminated insulating film is used, a single fundamental transverse mode is allowed to be maintained even in a high-output operation with over 100 mW. A thickness of a p-side light guide layer may be preferably, for example, 100 nm or less. It may be desirable that the band gap of a compound semiconductor forming the well layer in the active layer be 2.4 eV or more. Further, it may be desirable that the wavelength of laser light emitted from the active layer be within a range from 360 nm to 500 nm both inclusive, preferably a range from 400 nm to 410 nm both inclusive. Obviously, the above-described various configurations may be suitably combined.

As described above, in the second compound semiconductor layer, an undoped compound semiconductor layer (for example, an undoped GaInN layer or an undoped AlGaN layer) may be formed between the active layer and an electron barrier layer. Moreover, an undoped GaInN layer as the light guide layer may be formed between the active layer and the undoped compound semiconductor layer. An uppermost layer of the second compound semiconductor layer may be occupied by an Mg-doped GaN layer (p-side contact layer).

Various compound semiconductor layers (for example, GaN-based compound semiconductor layers) configuring the light-emitting device or the like according to the present disclosure are formed in order on the base substrate, and in addition to a sapphire substrate, examples of the base substrate include a GaAs substrate, a GaN substrate, a SiC substrate, an alumina substrate, a ZnS substrate, a ZnO substrate, an MN substrate, a LiMgO substrate, a LiGaO$_2$ substrate, a MgAl$_2$O$_4$ substrate, an InP substrate, a Si substrate, and one of these substrates with a surface (a main surface) where a base layer or a buffer layer is formed. In a case where the GaN-based compound semiconductor layer is formed on the substrate, the GaN substrate is typically preferable because of low defect density; however, it is known that the GaN substrate exhibits polarity, nonpolarity, or semipolarity, depending on a growth plane. Further, methods of forming various compound semiconductor layers (for example, GaN-based compound semiconductor layers) configuring the light-emitting device or the like according to the present disclosure may include metal organic chemical vapor deposition methods (a MOCVD method, a MOVPE method), a molecular beam epitaxy method (a MBE method), a hydride vapor deposition method in which halogens contribute to transport or reaction, and the like.

In this case, as an organic gallium source gas in the MOCVD method, a trimethylgallium (TMG) gas and a triethylgallium (TEG) gas may be used, and as a nitrogen source gas, an ammonia gas and a hydrazine gas may be used. To form a GaN-based compound semiconductor layer of an n-type conductivity type, for example, silicon (Si) may be added as an n-type impurity (n-type dopant), and to form a GaN-based compound semiconductor layer of a p-type conductivity type, for example, magnesium (Mg) may be added as a p-type impurity (p-type dopant). Moreover, in a case where aluminum (Al) or indium (In) is included as a constituent atom of the GaN-based compound semiconductor layer, a trimethylaluminum (TMA) gas may be used as an Al source, and trimethylindium (TMI) gas may be used as an In source.

In addition, a monosilane (SiH$_4$) gas may be used as a Si source, and a cyclopentadienylmagnesium gas, methylcyclopentadienylmagnesium, or bis(cyclopentadienyl)magnesium (Cp$_2$Mg) may be used as an Mg source. It is to be noted that, as the n-type impurity (n-type dopant), Ge, Se, Sn, C, Te, S, O, Pd, and Po may be used in addition to Si, and as the p-type impurity (p-type dopant), Zn, Cd, Be, Ca, Ba, C, Hg, and Sr may be used in addition to Mg.

As a dry etching method in the first method of manufacturing the light-emitting device according to the present disclosure, a well-known dry etching method may be adopted. Moreover, as an acid solution, phosphoric acid, hydrofluoric acid, or aqua regia may be used, and as an alkali solution, sodium hydroxide or potassium hydroxide may be used.

The light-emitting device or the like according to the present disclosure is applicable to, for example, fields such as optical disk systems, the communications field, the optical information field, opto-electronic integrated circuits, fields of application of nonlinear optical phenomena, optical switches, various analysis fields such as the laser measurement field, the ultrafast spectroscopy field, the multiphase excitation spectroscopy field, the mass analysis field, the microspectroscopy field using multiphoton absorption, quantum control of chemical reaction, the nano three-dimensional processing field, various processing fields using multiphoton absorption, the medical fields, and the bio-imaging field.

Example 1

Example 1 relates to the light-emitting device according to the present disclosure, and the first method of manufacturing the light-emitting device according to the present disclosure. Specifically, a light-emitting device of Example 1 is a laser diode device, and as illustrated in a schematic partial sectional view taken along a virtual plane perpendicular to an axis line of the light-emitting device in FIG. 1, the light-emitting device of Example 1 includes a laminate structure body 20 configured by laminating, in order, a first compound semiconductor layer 21 of a first conductivity type, an active layer (a light emission region or a gain region) 23 made of a compound semiconductor, and a second compound semiconductor layer 22 of a second conductivity type different from the first conductivity type on a base substrate 20', a second electrode 32 formed on the second compound semiconductor layer 22, and a first electrode 31 configured to be electrically connected to the first compound semiconductor layer 21.

Then, the first compound semiconductor layer 21 has a laminate structure including a first cladding layer (an n-type AlGaN layer) 121A and a first light guide layer (an n-type GaN layer) 121B in order from the base substrate, and the laminate structure body 20 has a ridge stripe structure 20A configured of the second compound semiconductor layer 22, the active layer 23, and a portion 121B' in a thickness direction of the first light guide layer, and $6 \times 10^{-7}$ m<$t_1$, preferably $8 \times 10^{-7}$ m≤$t_1$ may be satisfied, and $0(m)<t_1'≤0.5 \cdot t_1$, preferably $0(m)<t_1'≤0.3 \cdot t_1$ may be satisfied, where a thickness of the first light guide layer 121B is $t_1$, a thickness of the portion 121B' configuring the ridge stripe structure of the first light guide layer is $t_1'$. Specifically, in Example 1, the thickness $t_1$ was $t_1=1.25$ μm, and the thickness $t_1'$ was $t_1'=0.15$ μm. Moreover, a length and a width of the ridge stripe structure 20A were 1.0 mm and 1.6 μm, respectively. The light-emitting device emits a single-mode light beam.

It is to be noted that, specifically, the base substrate 20' is configured of an n-Type GaN substrate, and the compound semiconductor layer is disposed on a (0001) plane of the n-type GaN substrate. It is to be noted that the (0001) plane of the n-type GaN substrate layer is also called "C plane", and is a crystal plane having polarity. Moreover, the laminate structure body 20 configured of the first compound semiconductor layer 21, the active layer 23, and the second compound semiconductor layer 22 is made of a GaN-based compound semiconductor, specifically, an AlGaInN-based compound semiconductor, and more specifically the laminate structure body 20 has a layer structure illustrated in the following Table 1. In this case, in Table 1, compound semiconductor layers in Table 1 are listed in order of decreasing distance from the base substrate 20'. It is to be noted that a band gap of a compound semiconductor forming a well layer in the active layer 23 is 3.06 eV. The active layer 23 has a quantum well structure including a well layer and a barrier layer, and the doping concentration of an impurity (specifically, silicon, Si) in the barrier layer is within a range from $2 \times 10^{17}$ cm$^{-3}$ to $1 \times 10^{20}$ cm$^{-3}$ both inclusive. Moreover, a laminated insulating film 24 made of SiO$_2$/Si is formed on both sides of the ridge stripe structure 20A. It is to be noted that a SiO$_2$ layer is a lower layer, and a Si layer is an upper layer. Then, a second electrode (a p-side ohmic electrode) 32 is formed on a p-type GaN contact layer 122D corresponding to a top surface of the ridge stripe structure 20A. On the other hand, a first electrode (an n-side ohmic electrode) 31 made of Ti/Pt/Au is formed on a back surface of the base substrate 20'. In this example, the second electrode 32 is configured of a Pd single layer with a thickness of 0.1 p.m. A thickness of a p-type AlGaN electron barrier layer 122A is 10 nm, a thickness of a second light guide layer (a p-type AlGaN layer) 122B is 50 nm, a thickness of a second cladding layer (a p-type AlGaN layer) 122C is 0.5 μm, and a thickness of a p-type GaN contact layer 122D is 100 nm. Moreover, the p-type AlGaN electron barrier layer 122A, the second light guide layer 122B, the second cladding layer 122C, and the p-type GaN contact layer 122D configuring the second compound semiconductor layer 22 are doped with $1 \times 10^{19}$ cm$^{-3}$ or more (specifically, $2 \times 10^{19}$ cm$^{-3}$) of Mg. On the other hand, a thickness of the first cladding layer (the n-type AlGaN layer) 121A is 2.5 p.m. The thickness of the first light guide layer (the n-type GaN layer) 121B is as described above, and a thickness (1.25 μm) of the first light guide layer 121B is thicker than a thickness (100 nm) of the second light guide layer 122B. Further, the first light guide layer 121B is made of GaN; however, alternatively, the first light guide layer 121B may be made of a compound semiconductor having a band gap that is larger than that of the active layer 23 and is smaller than that of the first cladding layer 121A.

TABLE 1

Second compound semiconductor layer 22
    p-type GaN contact layer (Mg-doped) 122D
    Second cladding layer (p-type Al$_{0.05}$Ga$_{0.95}$N layer (Mg-doped)) 122C
    Second light guide layer (p-type Al$_{0.01}$Ga$_{0.99}$N layer (Mg-doped)) 122B
    p-type Al$_{0.20}$Ga$_{0.80}$N electron barrier layer (Mg-doped) 122A
Active layer 23
    GaInN quantum well active layer 23
    (Well layer: Ga$_{0.92}$In$_{0.08}$N/barrier layer: Ga$_{0.98}$In$_{0.02}$N)
First compound semiconductor layer 21
First light guide layer (n-type GaN layer) 121B
First cladding layer (n-type Al$_{0.03}$Ga$_{0.97}$N layer) 121A
Herein,
Well layer (two layers): 10 nm [undoped]
Barrier layer (three layers): 12 nm [Doping concentration (Si): $2 \times 10^{18}$ cm$^{-3}$]

Figure 4:
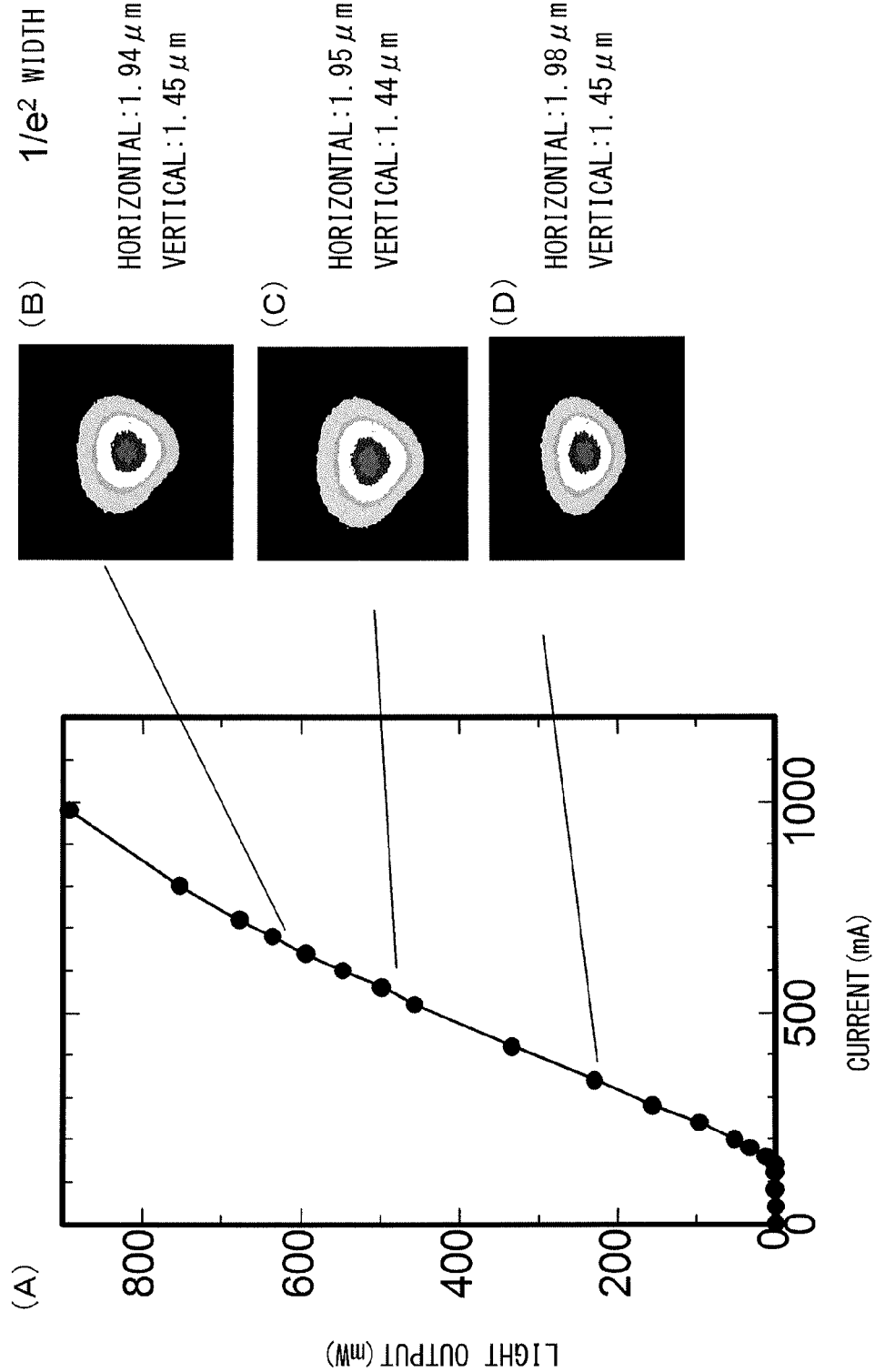
FIG. 4(A) is a graph illustrating a relationship between a current flowing from a second electrode to a first electrode and light output in the light-emitting device of Example 1, and FIGS. 4(B), (C), and (D) are photographs of a light beam obtained when the current flows from the second electrode to the first electrode.

FIG. 4(A) illustrates a relationship between a current (unit: milliampare) flowing from the second electrode 32 to the first electrode 31 and light output (unit: milliwatt) in the light-emitting device of Example 1, and FIGS. 4(B), (C), and (D) illustrate photographs of near-field patterns (NFPs) of light beams obtained when 340 milliampares, 520 milliamperes, and 720 milliamperes flew from the second electrode 32 to the first electrode 31, respectively, and also illustrate a dimension (width) in a horizontal direction (a width direction of the ridge stripe structure 20A) of the light beam and a dimension (width) in a vertical direction (the width direction of the ridge stripe structure 20A) of the light beam. It is to be noted that the illustrated dimensions (widths) are dimensions (widths) of a near-field pattern (NFP) of a light beam when reaching an intensity of 1/e$^2$ of peak intensity of a light beam emitted from a light-exit end surface (a second end surface) of the laminate structure body 20. As illustrated in FIGS. 4(B), (C), and (D), a value of LB$_Y$/LB$_X$ was as follows, and satisfied $0.2 \leq$ LB$_Y$/LB$_X \leq 1.2$, where the dimension (width) in the width direction of the ridge stripe structure 20A was LB$_X$, and the dimension (width) in a thickness direction of the ridge stripe structure 20A was LB$_Y$, and a light beam with a sectional shape close to a perfect circle was allowed to be obtained. Moreover, in the light-exit end surface of the laminate structure body 20, a distance Y$_{CC}$ from a central point of the active layer 23 in the laminate structure body 20 to a central point of a light beam emitted from the laminate structure body 20 along the thickness direction of the ridge stripe structure 20 was as follows, and satisfied $t_1' \leq Y_{CC} \leq t_1$. As can be seen from FIG. 4(A), a threshold current was about 200 milliamperes, and light output of up to about 900 milliwatts was allowed to be obtained.

FIG. 4(B): LB$_Y$/LB$_X$=0.75
FIG. 4(C): LB$_Y$/LB$_X$=0.74
FIG. 4(D): LB$_Y$/LB$_X$=0.73
FIG. 4(B): Y$_{CC}$=5×10$^{-7}$ m
FIG. 4(C): Y$_{CC}$=5×10$^{-7}$ m
FIG. 4(D): Y$_{CC}$=5×10$^{-7}$ m

Figure 2:
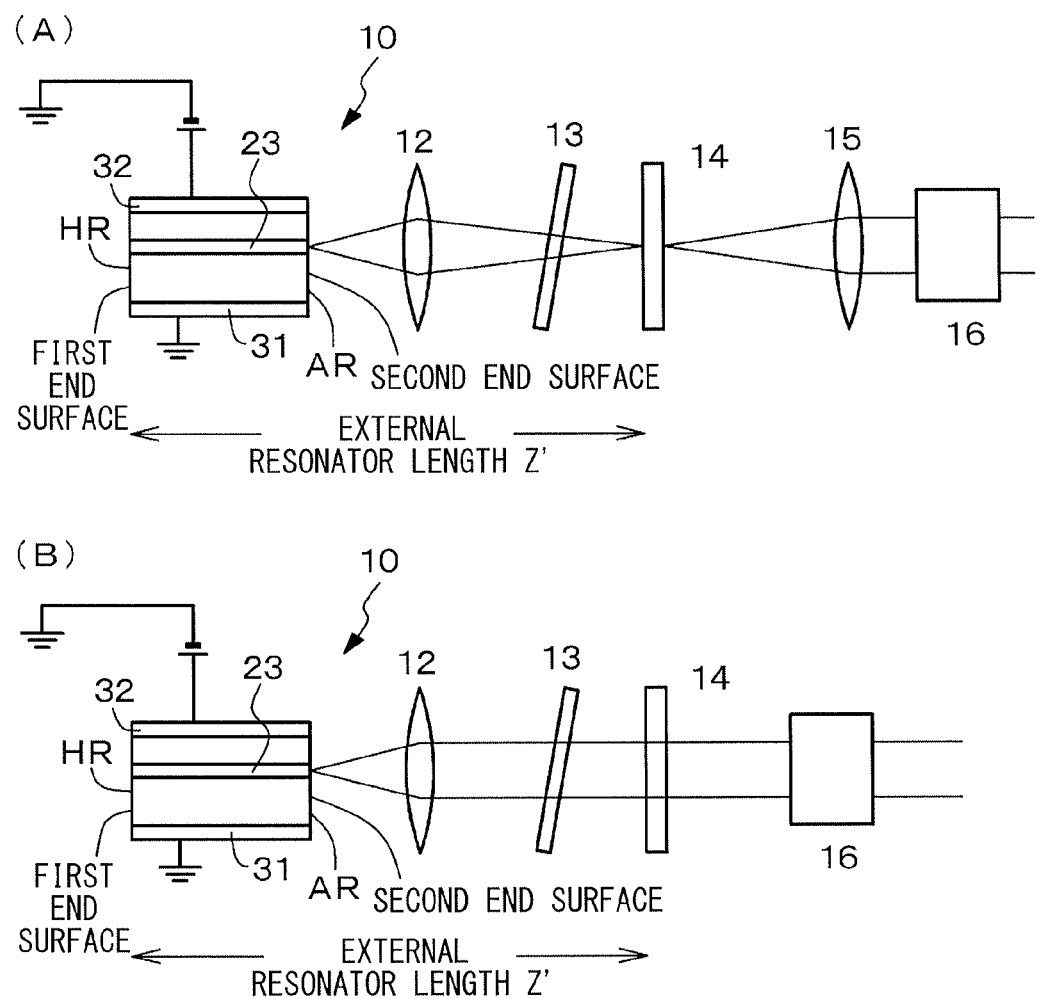
FIGS. 2(A) and (B) are conceptual diagrams of a laser diode unit assembly including the light-emitting device of Example 1.

FIG. 2(A) illustrates a conceptual diagram of a laser diode unit assembly including the light-emitting device of Example 1. The laser diode unit assembly illustrated in FIG. 2(A) is of an external resonator type. In other words, the laser diode unit assembly in Example 1 is configured of a laser diode device 10 configured of the light-emitting device of Example 1, a lens 12, an optical filter 13, an external mirror 14, and a lens 15. Then, laser light emitted from a laser light source exits through an optical isolator 16. A low-reflective coating layer (AR) or an antireflective coating layer (AR) having a structure in which, for example, one titanium oxide layer and one aluminum oxide layer are laminated is formed on a second end surface serving as a light-exit end surface of the laser diode device 10. Moreover, a high-reflective coating layer (HR) is formed on a first end surface facing the second end surface. Then, the first end surface of the laser diode device and the external mirror 14 configure an external resonator, and as described above, a laser beam is extracted from the external mirror 14. As the optical filter 13, mainly a bandpass filter is used, and the optical filter 13 is inserted to control the oscillation wavelength of a laser. The recurrence frequency f of a light pulse train is determined by an external resonator length Z', and is represented by the following expression. Herein, c is the speed of light, and n is a refractive index of a waveguide. The value of the external resonator length (Z', unit: mm) is 100 mm. Moreover, light reflectivity of the second end surface emitting a light beam (a light pulse) of the laminate structure body 20 is 0.5% or less (for example, 0.3%), and light reflectivity of the first end surface reflecting a light beam (a light pulse) of the laminate structure body 20 may be, for example, within a range from 85% inclusive to less than 100% (for example, 95%). Further, light reflectivity of the optical filter 13 may be, for example, a range from 85% inclusive to less than 100% (for example, 90%), a half-value width is within a range from greater than 0 nm to 2 nm inclusive (for example, 1 nm), and a peak wavelength is within a range from 400 nm to 450 nm both inclusive (for example, 410 nm), and light reflectivity of the external mirror 14 is within a range from greater than 0% to less than 100% (for example, 20%). Obviously, it is to be noted that the values of the above-described various parameters are merely examples, and may be appropriately modified.

$$f=c/(2n \cdot Z)$$

Alternatively, also in a collimating type external resonator illustrated in FIG. 2(B), an end surface where a high-reflective coating layer (HR) is formed of the laser diode device and the external mirror 14 configure an external resonator, and a light beam is extracted from the external mirror 14.

Figure 3:
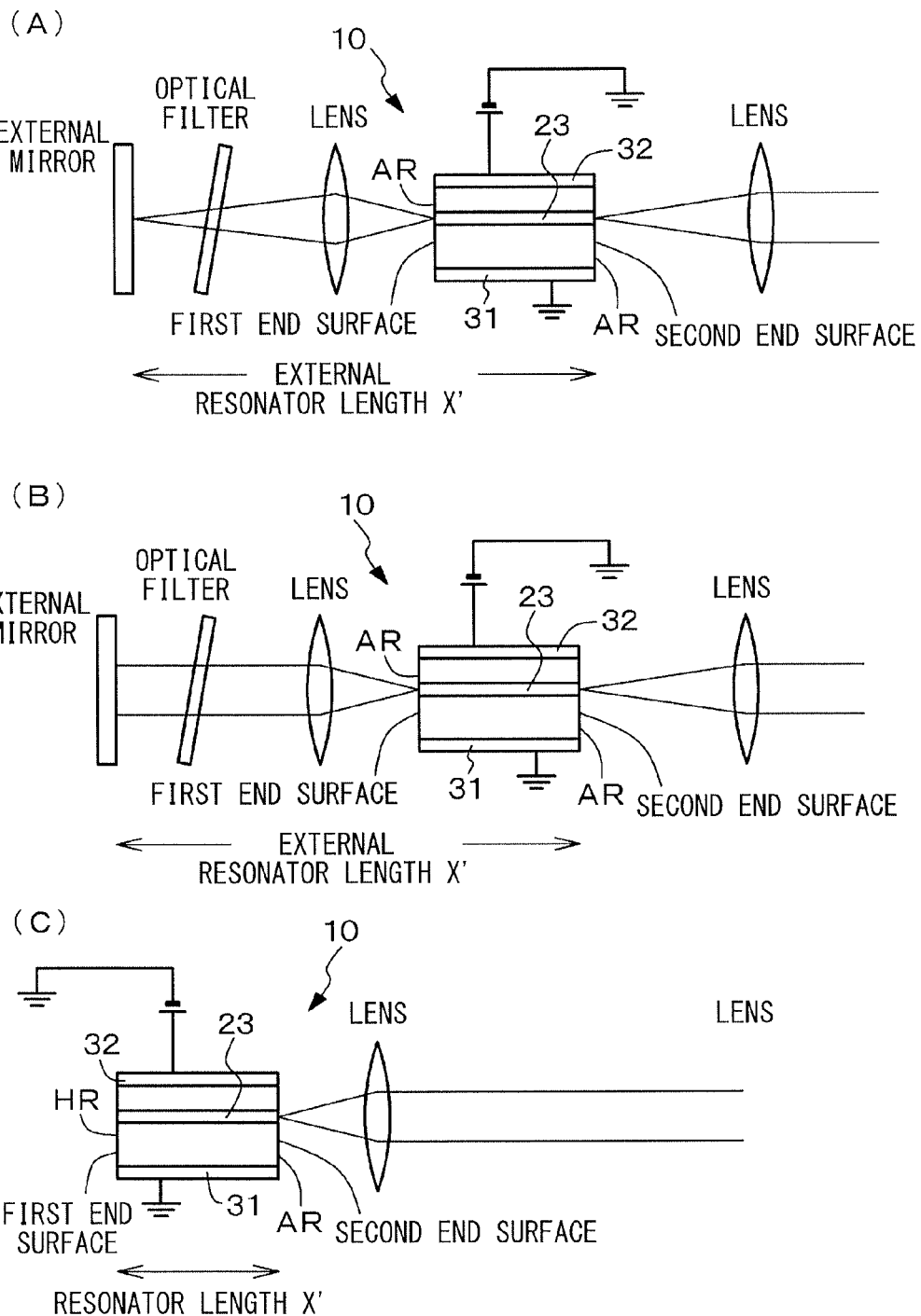
FIGS. 3(A), (B), and (C) are conceptual diagrams of another laser diode unit assembly including the light-emitting device of Example 1.

In external resonators illustrated in FIGS. 3(A) and (B), the second end surface of the laser diode device and the external mirror configure each of the external resonators, and a light beam is extracted from the laser diode device. A low-reflective coating layer (AR) is formed on the second end surface. It is to be noted that an example illustrated in FIG. 3(A) is of a condensing type and an example illustrated in FIG. 3(B) is of a collimating type. Alternatively, as illustrated in FIG. 3(C), the laser diode device may be of a monolithic type.

A method of manufacturing the light-emitting device of Example 1 will be described below referring to FIGS. 5(A) and (B) and FIGS. 6(A) and (B) illustrating schematic partial sectional views of a base substrate and the like.

[Step-100]

Figure 5:
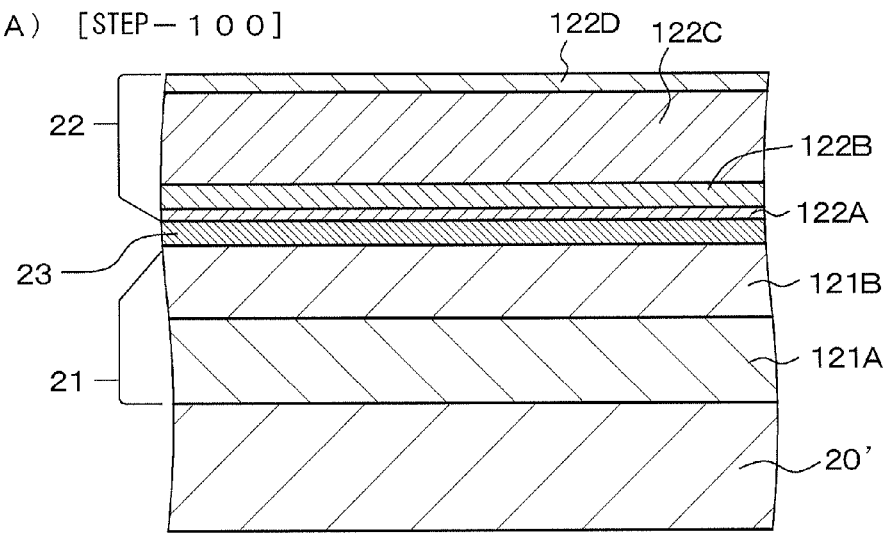
FIGS. 5(A) and (B) are schematic partial sectional views of a base substrate and the like taken along a virtual plane perpendicular to the axis line of the light-emitting device of Example 1 for describing a method of manufacturing the light-emitting device.
Figure 5:
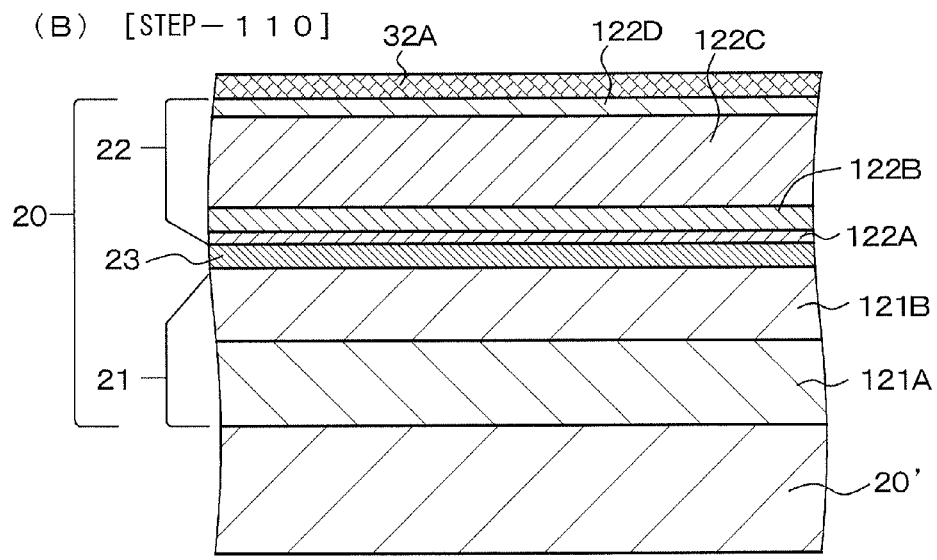
Figure 6:
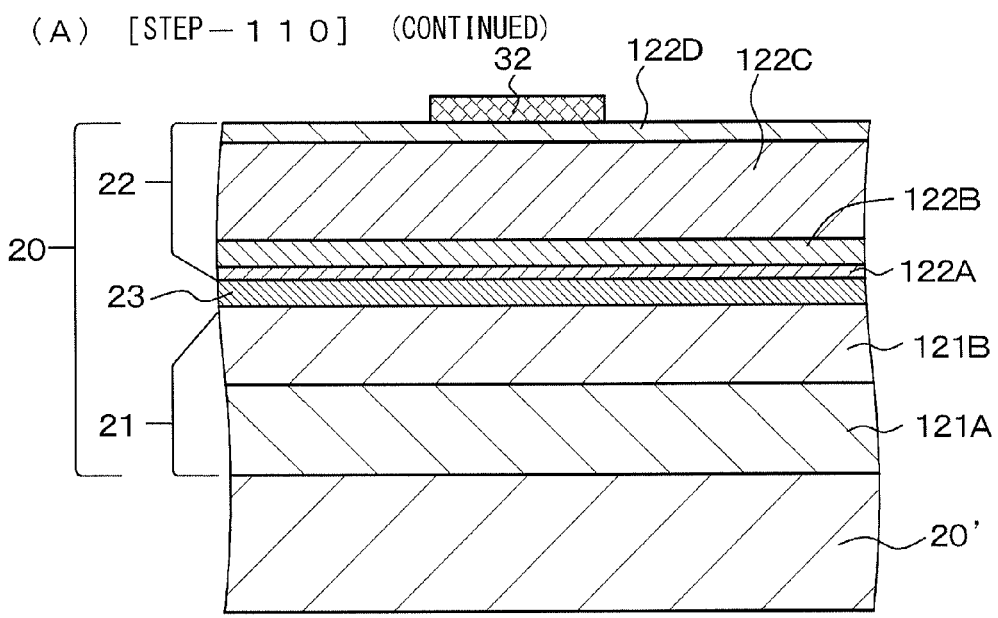
FIGS. 6(A) and (B) are schematic partial sectional views, following FIG. 5(B), of the base substrate and the like taken along the virtual plane perpendicular to the axis line of the light-emitting device of Example 1 for describing the method of manufacturing the light-emitting device.
Figure 6:
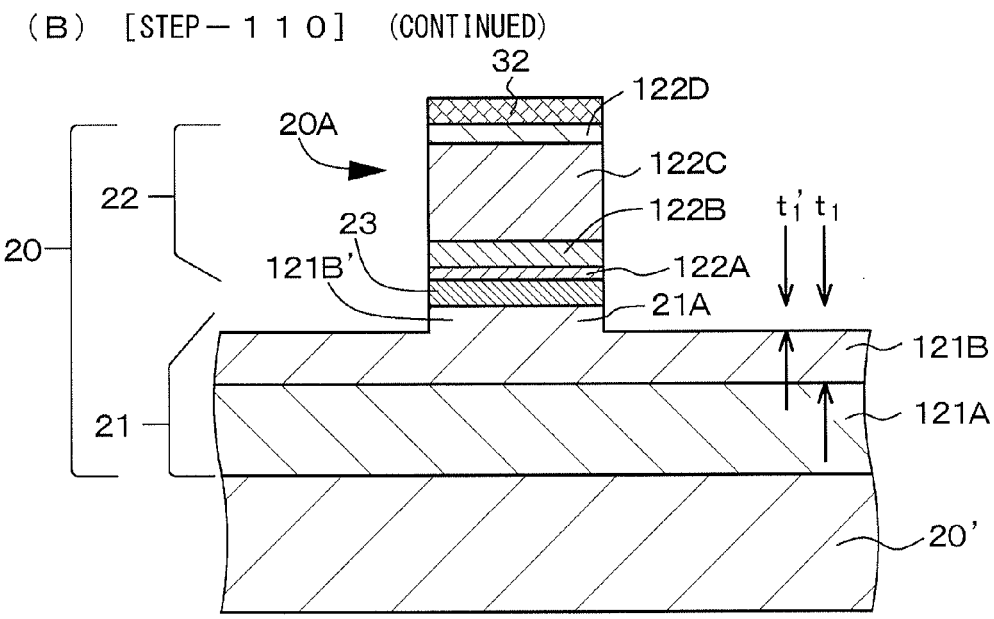

First, the laminate structure body 20 configured by laminating, in order, the first compound semiconductor layer 21 of the first conductivity type (n-type) made of a GaN-based compound semiconductor, the active layer (the light emission region or the gain region) 23 made of a GaN-based compound semiconductor, and the second compound semiconductor layer 22 of the second conductivity type (p-type) made of a GaN-based compound semiconductor, the second conductivity type being different from the first conductivity type is formed on the base substrate 20', specifically, on a (0001) plane of an n-type GaN substrate by a known MOCVD method (refer to FIG. 5(A)).

Next, the second compound semiconductor layer 22 and the active layer 23 are etched by a dry etching method, and a portion of the first compound semiconductor layer 21 (specifically, the first light guide layer 121B) is also etched in a thickness direction by the dry etching method to form the ridge stripe structure 20A.

[Step-110]

Specifically, first, the strip-like second electrode 32 is formed on the second compound semiconductor layer 22. More specifically, after a Pd layer 32A is entirely formed by a vacuum deposition method (refer to FIG. 5(B)), a strip-like resist layer for etching is formed on the Pd layer 32A by a photolithography technique. Then, after a portion not covered with the resist layer for etching of the Pd layer 32A is removed with use of aqua regia, the resist layer for etching is removed. Thus, a structure illustrated in FIG. 6(A) is allowed to be obtained. It is to be noted that the strip-like second electrode 32 may be formed on the second compound semiconductor layer 22 by a liftoff method.

It may be desirable to satisfy $ER_0/ER_1 \geq 1 \times 10$, preferably $ER_0/ER_1 \geq 1 \times 10^2$, where an etching rate of the second electrode 32 when the second electrode 32 is patterned is $ER_0$, an etching rate of the laminate structure body 20 is $ER_1$. When $ER_0/ER_1$ satisfies such a relationship, the second electrode 32 is allowed to be reliably patterned without etching the laminate structure body 20 (or with only slightly etching the laminate structure body 20).

Next, the ridge stripe structure 20A is formed by etching the second compound semiconductor layer 22 and the active layer 23 with use of the second electrode 32 as an etching mask by the dry etching method, and further etching a portion of the first compound semiconductor layer 21 in the thickness direction by the dry etching method. Specifically, the second compound semiconductor layer 22, the active layer 23, and a portion of the first compound semiconductor layer 21 (specifically, a portion of the first light guide layer 121B) are etched by a RIE method using a $Cl_2$ gas with use of the second electrode 32 as an etching mask to obtain a portion 121B' of the light guide layer 121B. Thus, a structure illustrated in FIG. 6(B) is allowed to be obtained. Since the ridge stripe structure 20A is formed through a self-alignment system with use of, as an etching mask, the second electrode 32 patterned into a strip shape in such a manner, misalignment does not occur between the second electrode 32 and the ridge stripe structure 20A.

[Step-120]

After that, the etched portion is immersed in an acid solution, specifically, phosphoric acid. When the second compound semiconductor layer 22, the active layer 23, and the first compound semiconductor layer 21 are etched by the dry etching method in [Step-110], etching damage to these compound semiconductor layers may be caused; however, the etching damage is allowed to be removed by immersing the etched portion in the acid solution, and the laminate structure body 20 with high quality and high reliability is allowed to be obtained accordingly.

[Step-130]

After that, formation of the laminated insulating film 24, removal of the laminated insulating film on the second electrode 32, formation of the first electrode 31, cleavage of a substrate, and the like are performed, and packaging is further performed; therefore, the light-emitting device of Example 1 is allowed to be fabricated.

It is to be noted that the ridge stripe structure 20 may be formed after [Step-100] without forming the second electrode 32, and then the second electrode 32 may be formed after [Step-120] is executed, and after that, [Step-130] may be executed.

In the light-emitting device of Example 1 or the method of manufacturing the light-emitting device, since the thickness $t_1$ of the first light guide layer is determined; an optical confinement factor is allowed to be reduced, and a peak of an optical field intensity distribution is moved from the active layer to the first light guide layer, and as a result, light density around the active layer is allowed to be reduced during a high-output operation, and not only prevention of optical damage but also output enhancement are allowed to be achieved. Moreover, in Example 1, the thickness of the portion configuring the ridge stripe structure of the first light guide layer is determined; therefore, the mode of a light beam to be emitted is allowed to be a single mode. Further, since a width of a slab waveguide and a thickness of the first light guide layer are substantially equal to each other, the light beam is allowed to have a sectional shape close to a perfect circle, and adverse effects such as deterioration in condensing characteristics are not caused in applications using a lens or an optical fiber.

Example 2

Example 2 is a modification of the light-emitting device of Example 1, and relates to the second method of manufacturing the light-emitting device according to the present disclosure. Specifically, a light-emitting device of Example 2 is also a laser diode device, and as illustrated in a schematic partial sectional view taken along a virtual plane perpendicular to an axis line of the light-emitting device in FIG. 7(C), two recess sections 25 extending along an axis line direction of the light-emitting device are formed in the base substrate 20'. Then, the laminate structure body 20 described in Example 1 is formed entirely, i.e., on the two recess sections 25 and a region 26 sandwiched between the two recess sections 25 of the base substrate 20'. Moreover, the second electrode 32 is disposed above the region 26 of the base substrate 20'.

In this case, the first compound semiconductor layer 21 has a laminate structure including a first cladding layer and a first light guide layer in order from a base substrate, and $6\times10^{-7}$ m$<t_1$, preferably $8\times10^{-7}$ m$\leq t_1$ may be satisfied, and $(T_{Total}-0.5 \cdot t_1) \leq D \leq T_{Total}$, preferably $(T_{Total}-0.3 \cdot t_1) \leq D \leq T_{Total}$ may be satisfied, where a thickness of the first light guide layer on the region 26 sandwiched between the two recess sections 25 of the base substrate 20' is $t_1$, a total thickness of the laminate structure body is $T_{Total}$, and a depth of the recess section 25 is D. Specifically, in Example 2, the thickness $t_1$ was $t_1$=1.25 µm, the total $T_{Total}$ was $T_{Total}$=4.1 µm, and the depth D was D=3.7 µm. Moreover, a width of the recess section 25 was 20 µm, a width of the region 26 sandwiched between the two recess sections 25 of the base substrate 20' was 1.5 p.m.

The light-emitting device of Example 2, and a laser diode unit assembly including the light-emitting device of Example 2 have configurations and structures similar to those of the light-emitting device of Example 1 and the laser diode unit assembly including the light-emitting device of Example 1, except for the above-described points, and will not be further described in detail.

A method of manufacturing the light-emitting device of Example 2 will be described below referring to FIGS. 7(A), (B), and (C) illustarting schematic partial sectional views of the base substrate and the like.

[Step-200]

Figure 7:
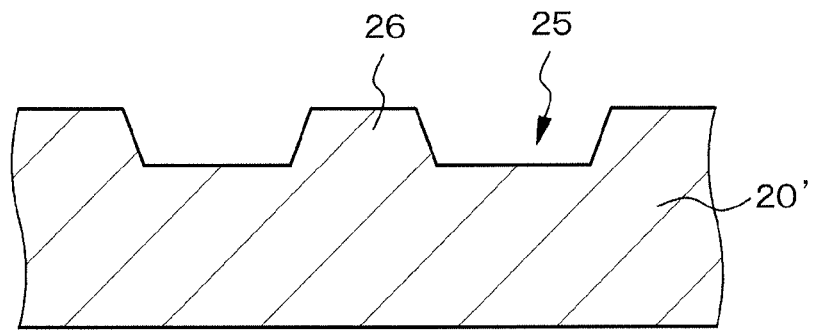
FIGS. 7(A), (B), and (C) are schematic partial sectional views of a base substrate and the like taken along a virtual plane perpendicular to an axis line of a light-emitting device of Example 2 for describing a method of manufacturing the light-emitting device.
Figure 7:
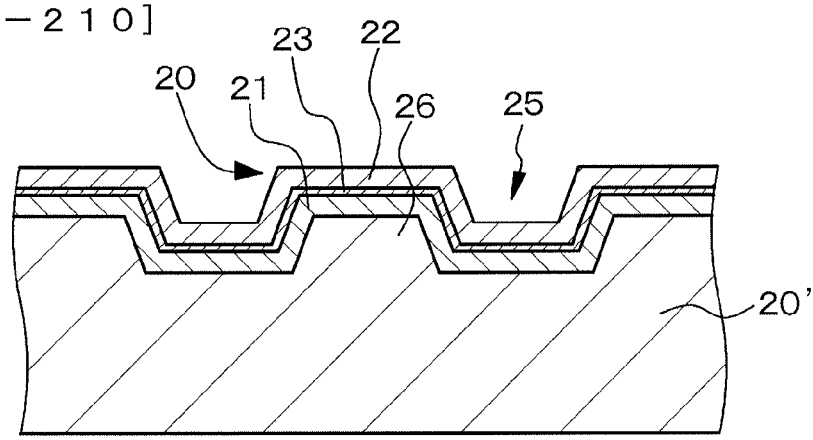
Figure 7:
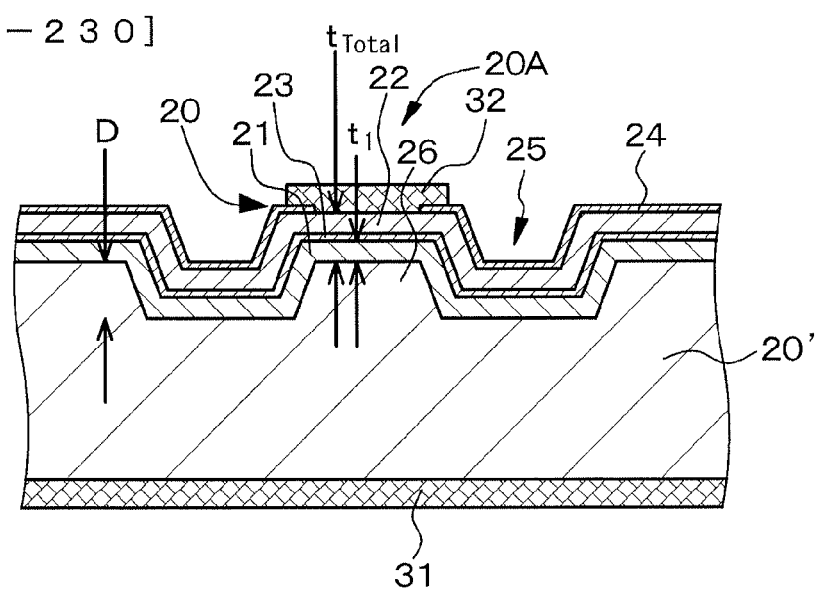

First, the two recess sections 25 are formed along the axis line direction of the light-emitting device that is supposed to be manufactured by a known photolithography technique and a known dry etching method to obtain the region 26 sandwiched between the two recess sections 25 of the base substrate 20' (refer to FIG. 7(A)).

[Step-210]

Next, as with [Step-100] in Example 1, the laminate structure body 20 configured by laminating, in order, the first compound semiconductor layer 21 of the first conductivity type (n-type), the active layer (the light emission region or the gain region) 23 made of a compound semiconductor, and the second compound semiconductor layer 22 of the second conductivity type (p-type) different from the first conductivity type is formed on the base substrate 20', specifically, on a (0001) plane of an n-type GaN substrate, and more specifically on the two recess sections 25 and the region 26 sandwiched between the two recess sections 25 of the base substrate 20' by a known MOCVD method.

[Step-220]

Next, the laminated insulating film 24 is entirely formed, and an opening is formed in a region where the second electrode is supposed to be formed by a photolithography technique and a dry etching technique. Then, after a metal material layer configuring the second electrode is formed on the laminated insulating film 24 including the inside of the opening, the second electrode 32 is allowed to be provided by patterning the metal material layer by a photolithography technique and a dry etching technique.

[Step-230]

After that, formation of the first electrode 31 (refer to FIG. 7(C)), cleavage of a substrate, and the like are performed, and packaging is further performed; therefore, the light-emitting device of Example 2 is allowed to be fabricated.

In the method of manufacturing the light-emitting device of Example 2, since the thickness $t_1$ of the first light guide layer located on the region sandwiched between two recess sections of the base substrate (i.e., a portion located between the recess sections of the base substrate) is determined, light density around the active layer is allowed to be reduced during a high-output operation, and not only prevention of optical damage but also an increase in saturation energy of amplified light and output enhancement are allowed to be achieved. Moreover, in the method of manufacturing the light-emitting device of Example 2, the depth D of the recess section is also determined; therefore, the mode of a light beam to be emitted is allowed to be the single mode. Further, since the width of the slab waveguide and the thickness of the first light guide layer are substantially equal to each other, the light beam is allowed to have a sectional shape close to a perfect circle, and adverse effects such as deterioration in condensing characteristics are not caused in applications using a lens or an optical fiber. In addition, in Example 2, it is not necessary to perform dry etching on the laminate structure body to obtain the ridge stripe structure; therefore, a decline in reliability of the laminate structure body is preventable.

Example 3

Example 3 is also a modification of the light-emitting device of Example 1, and relates to the third method of manufacturing the light-emitting device according to the present disclosure. Specifically, a light-emitting device of Example 3 is also a laser diode device, and as illustrated in a schematic partial sectional view taken along a virtual plane perpendicular to an axis line of the light-emitting device in FIG. 9(B), a first portion $21_1$ of the first compound semiconductor layer 21 has a laminate structure including the first cladding layer 121A and a first portion $121B_1$ of the first light guide layer 121B in order from the base substrate, and a second portion $21_2$ of the first compound semiconductor layer 21 is configured of a second portion $121B_2$ of the first light guide layer 121B. Then, a growth inhibition layer 27 made of SiO$_2$ is formed on a top surface of the first portion $121B_1$ of the first light guide layer 121B. Provided that a total of thicknesses of the first portion $121B_1$ of the first light guide layer 121B and the second portion $121B_2$ of the first light guide layer 121B is $t_1$, and a thickness of the second portion $121B_2$ of the first light guide layer 121B is $t_1'$, $6\times10^{-7}$ m$<t_1$, preferably $8\times10^{-7}$ m$\leq t_1$ may be satisfied, and $0(m)<t_1'\leq0.5\cdot t_1$, preferably $0(m)<t_1'\leq0.3\cdot t_1$ may be satisfied. Specifically, in Example 3, the thickness $t_1$ was $t_1$=1.25 µm, and the thickness $t_1'$ was $t_1'$=0.15 µm.

The light-emitting device of Example 3, and a laser diode unit assembly including the light-emitting device of Example 3 have configurations and structures similar to those of the light-emitting deice of Example 1 and the laser diode unit assembly including the light-emitting device of Example 1, except for the above-described points, and will not be further described in detail.

Figure 8:
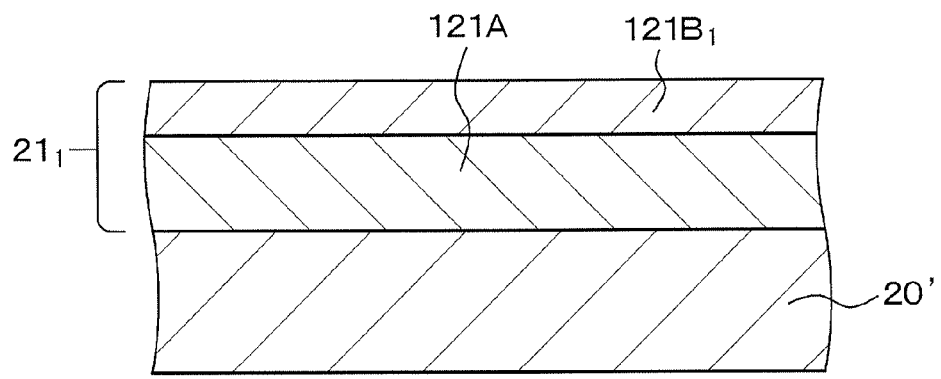
FIGS. 8(A) and (B) are schematic partial sectional views of a base substrate and the like taken along a virtual plane perpendicular to an axis line of a light-emitting device of Example 3 for describing a method of manufacturing the light-emitting device.
Figure 8:
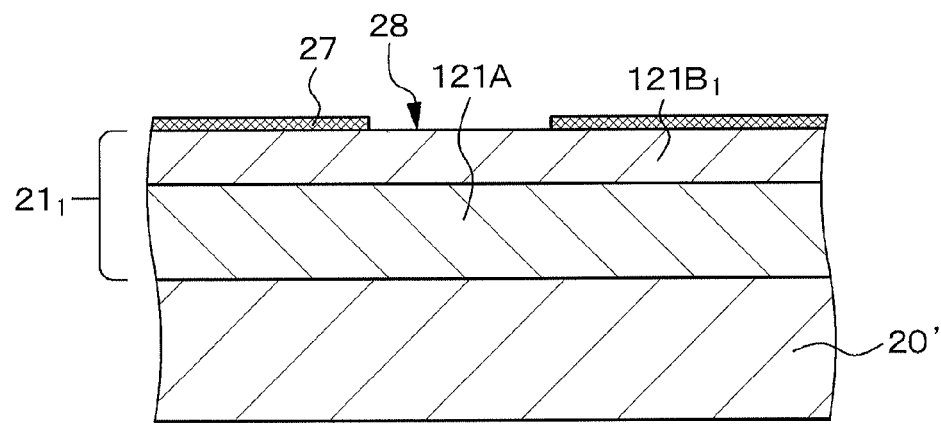

A method of manufacturing the light-emitting device of Example 3 will be described below referring to FIGS. 8(A) and (B) and FIGS. 9(A) and (B) illustrating schematic partial sectional views of the base substrate and the like.

[Step-300]

First, the first portion $21_1$ of the first compound semiconductor layer 21 of the first conductivity type is formed on the base substrate 20'. Specifically, the first compound semiconductor layer 21 of the first conductivity type (n-type) made of a GaN-based compound semiconductor, specifically the first cladding layer (n-type AlGaN layer) 121A and the portion $121B_1$ of the first light guide layer (n-type GaN layer) are formed on the base substrate 20' (specifically, on a (0001) plane of an n-type GaN substrate) by a known MOCVD method (refer to FIG. 8(A)).

[Step-310]

Next, the growth inhibition layer 27 is formed on the first portion $21_1$ of the first compound semiconductor layer 21 so as to allow a region where the ridge stripe structure 20A is supposed to be formed of the first portion $21_1$ of the first compound semiconductor layer 21 (the portion $121B_1$ of the first light guide layer) to be exposed. In other words, the growth inhibition layer 27 having an opening 28 in a region where the ridge stripe structure 20A is supposed to be formed is formed on the first portion $21_1$ of the first compound semiconductor layer 21. The growth inhibition layer 27 is formed specifically entirely, more specifically on the portion $121B_1$ of the first light guide layer (the n-type GaN layer) by a CVD method. Then, the opening 28 is formed in the region where the ridge stripe structure 20A is supposed to be formed of the growth inhibition layer 27 by a photolithography technique and a dry etching technique (refer to FIG. 8(B)).

[Step-320]

Figure 9:
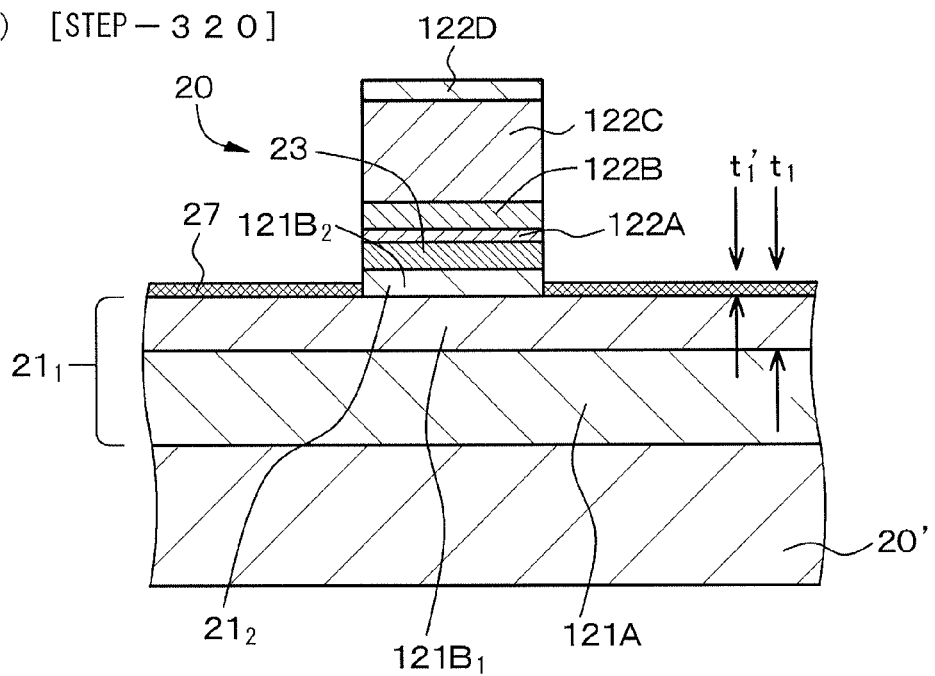
FIGS. 9(A) and (B) are schematic partial sectional views, following FIG. 8(B), of the base substrate and the like taken along the virtual plane perpendicular to the axis line of the light-emitting device of Example 1 for describing the method of manufacturing the light-emitting device.
Figure 9:
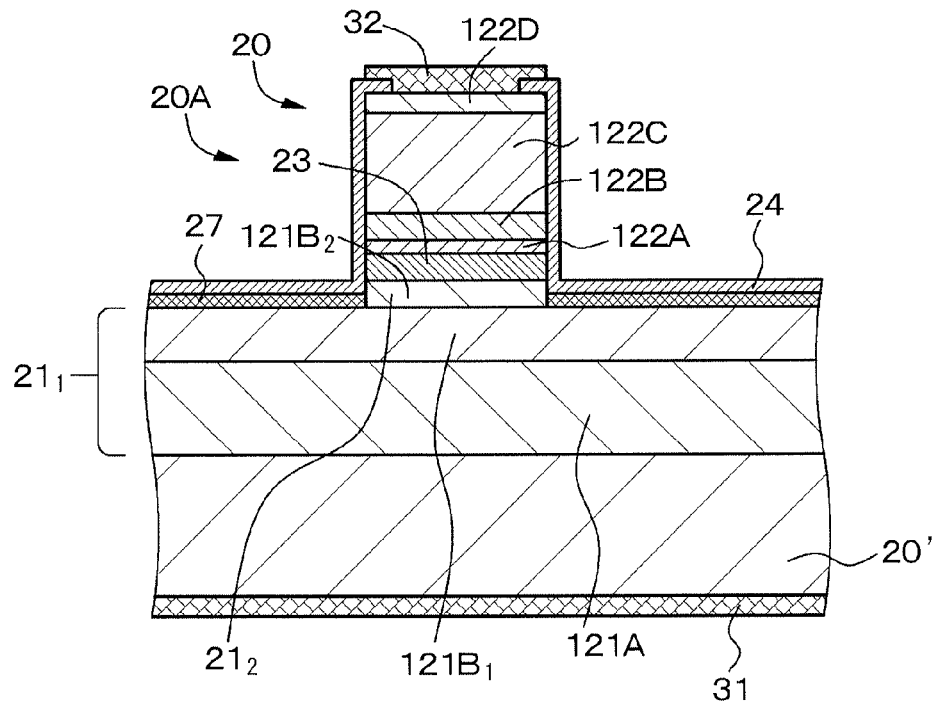

After that, the laminate structure body 20 configured by laminating, in order, the second portion $21_2$ of the first compound semiconductor layer 21 (the second portion $121B_2$ of the light guide layer), the active layer 23 made of a compound semiconductor, the second compound semiconductor layer 22 of the second conductivity type different from the first conductivity type is formed on a region exposed from a bottom of the opening 28 of the first portion $21_1$ of the first compound semiconductor layer 21 (the portion $121B_1$ of the light guide layer) (refer to FIG. 9(A)). Specifically, a step similar to [Step-100] in Example 1 is executed. The second portion $21_2$ and the like of the first compound semiconductor layer 21 do not grow or hardly grows on the growth inhibition layer 27. The second portion $21_2$ and the like of the first compound semiconductor layer 21 on the growth inhibition layer 27 may be removed by an etching method, or even if the second portion $21_2$ and the like of the first compound semiconductor layer 21 on the growth inhibition layer 27 remains, no issue arises.

[Step-330]

Next, the laminated insulating film 24 is entirely formed, and an opening is formed in a region where the second electrode is supposed to be formed of the laminated insulating film 24 by a photolithography technique and a dry etching technique. Then, after a metal material layer configuring the second electrode is formed on the laminated insulating film 24 including the inside of the opening, the second electrode 32 is allowed to be provided by patterning the metal material layer by a photolithography technique and a dry etching technique.

[Step-340]

After that, formation of the first electrode 31 (refer to FIG. 9(B)), cleavage of a substrate, and the like are performed, and packaging is further performed; therefore, the light-emitting device of Example 3 is allowed to be fabricated.

In the method of manufacturing the light-emitting device of Example 3, since the total $t_1$ of the thicknesses of the first portion and the second portion of the first light guide layer is determined, an optical confinement factor is allowed to be reduced, and a peak of an optical field intensity distribution is moved from the active layer to the first light guide layer, and as a result, light density around the active layer is allowed to be reduced during a high-output operation, and not only prevention of optical damage but also output enhancement are allowed to be achieved. Moreover, in the method of manufacturing the light-emitting device of Example 3, the thickness $t_1'$ of the second portion of the first light guide layer is also determined; therefore, the mode of a light beam to be emitted is allowed to be the single mode. Further, since the width of the slab waveguide and the thickness of the first light guide layer are substantially equal to each other, the light beam is allowed to have a sectional shape close to a perfect circle, and adverse effects such as deterioration in condensing characteristics are not caused in applications using a lens or an optical fiber. In addition, in Example 3, it is not necessary to perform dry etching on the laminate structure body to obtain the ridge stripe structure; therefore, a decline in reliability of the laminate structure body is preventable.

Example 4

Figure 10:
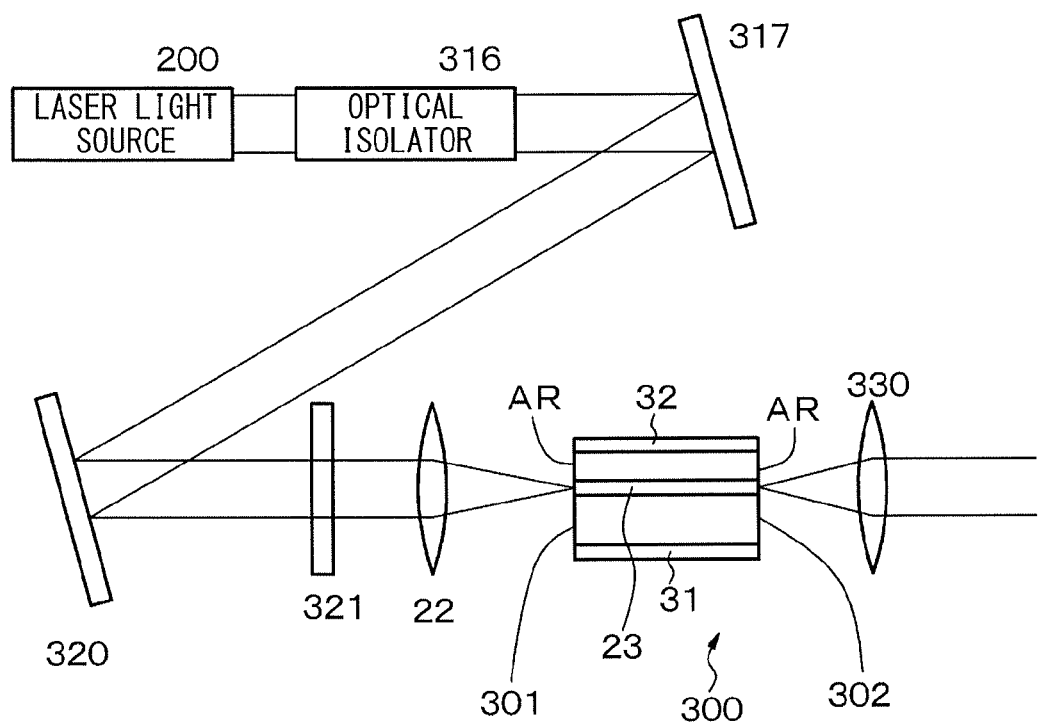
FIG. 10 is a conceptual diagram of a light output unit including a semiconductor optical amplifier as a light-emitting device of Example 4.

Example 4 is a modification of any of Examples 1 to 3, and a semiconductor optical amplifier (SOA) 300 optically amplifying laser light from a laser light source 200 and then outputting the amplified laser light is configured of a light-emitting device of Example 4. FIG. 10 illustrates a conceptual diagram of a light output unit of Example 4 including the semiconductor optical amplifier. A laser diode device configuring the laser light source 200 and the semiconductor optical amplifier 300 have substantially same configuration and structure as those of the light-emitting devices described in Examples 1 to 3.

In the light output unit of Example 4, laser light emitted from the laser light source 200 enters a reflective mirror 320 through an optical isolator 316 and a reflective mirror 317. The laser light reflected by the reflection mirror 320 enters the semiconductor optical amplifier 300 through a half-wavelength plate ($\lambda/2$ wavelength plate) 321 and a lens 322. It is to be noted that the optical isolator 316 is arranged to prevent return light from the semiconductor optical amplifier 300 from going toward the laser light source 200. Then, the laser light is optically amplified by the semiconductor optical amplifier 300 and exits from a system through a lens 330.

The semiconductor optical amplifier 300 is configured of a transmissive type semiconductor optical amplifier. Then, a low-reflective coating layer (AR) is formed on a light-incident end surface (first end surface) 301 of the semiconductor optical amplifier 300 and a light-exit end surface (second end surface) 302 facing the light-incident end surface 301. The low-reflective coating layer (AR) has a structure in which one titanium oxide layer and one aluminum oxide layer are laminated. The laser light incident from the light-incident end surface 301 is optically amplified in the semiconductor optical amplifier 300 and is output from the light-exit end surface 302 opposite to the light-incident end surface 301. The laser light is basically guided only in one direction. Moreover, in Example 4, the laser light source 200 is configured of the laser diode unit assembly of Example 1 including the laser diode device that is the light-emitting device of Example 1, and laser light emitted from the laser light source 200 enters the semiconductor optical amplifier 300. Specifically, the laser light source 200 generating laser light that is allowed to enter the semiconductor optical amplifier 300 is configured of a mode-locked laser diode device, and pulse laser light emitted from the mode-locked laser diode device enters the semiconductor optical amplifier 300.

The light-emitting device of Example 4 has the same configuration and structure as those of the light-emitting device of Example 1, except for the above-described points, and will not be further described in detail. It is to be noted that the semiconductor optical amplifier is configured of a transmissive type semiconductor optical amplifier; however, the semiconductor optical amplifier is not limited thereto, and may be configured of, for example, a monolithic type semiconductor optical amplifier.

Figure 11:
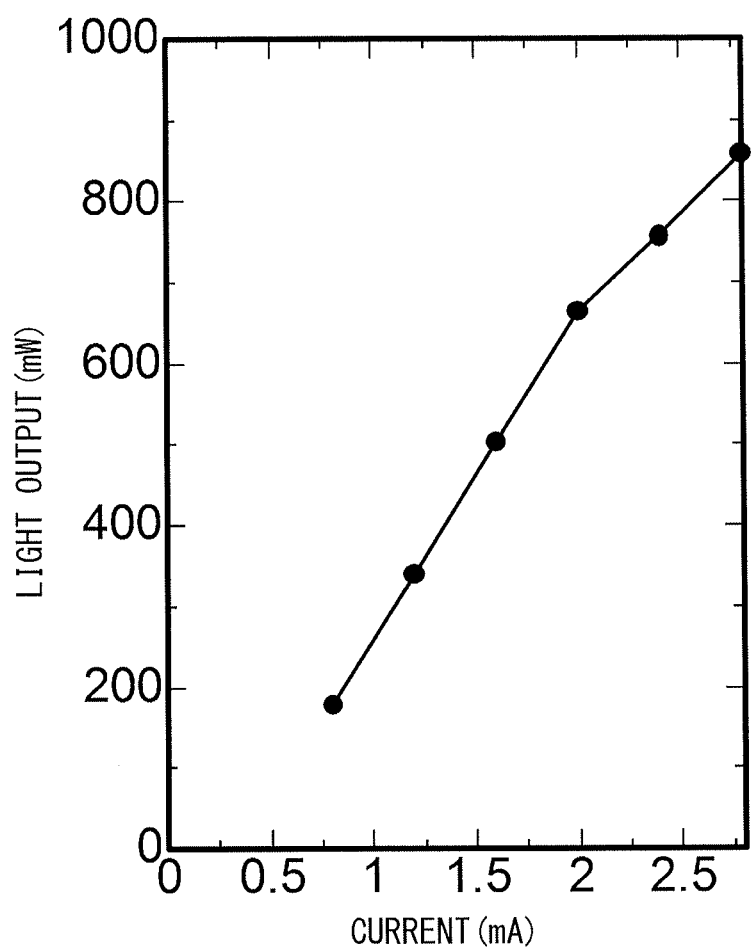
FIG. 11 is a graph illustrating a relationship between a current flowing from a second electrode to a first electrode and light output in the light-emitting device of Example 4.

In Example 4, the length and the width of the ridge stripe structure 20A were 3.0 mm and 2.2 μm, respectively. Then, in a case where mode-locked pulse light with a wavelength of 399 nm, a recurrence frequency of 1 GHz, a light pulse width of 2.1 picoseconds, and incident light average power of 5.3 milliwatts entered the semiconductor optical amplifier 300 of Example 4, as illustrated in FIG. 11, when an amplifier drive current (a current flowing from the second electrode 32 to the first electrode 31) was 2.8 amperes, an average output of 800 milliwatts or more was allowed to be obtained. Even though the width of the ridge stripe structure 20A was as narrow as about 2.2 μm, an amplification characteristic in which the average light output was extremely greater than an average light output of 400 milliwatts of the semiconductor optical amplifier in related art was obtained, and it was confirmed that the pulse light was in a single mode.

Example 5

Figure 12:
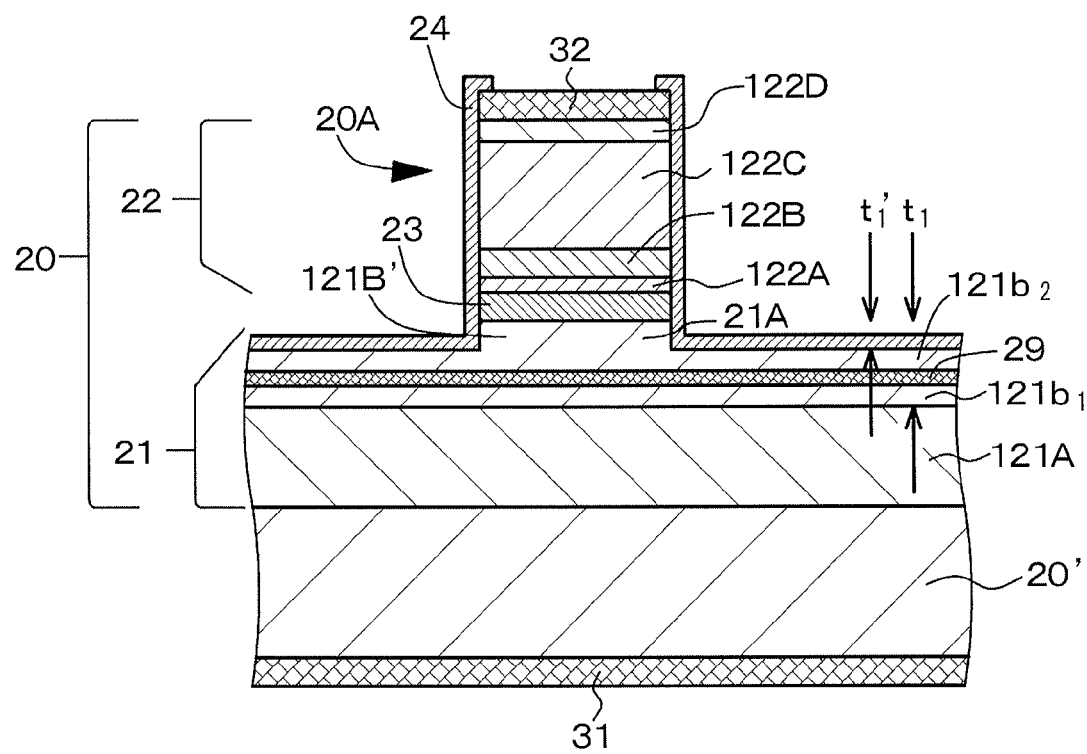
FIG. 12 is a schematic partial sectional view of a light-emitting device of Example 5 taken along a virtual plane perpendicular to an axis line of the light-emitting device.
Figure 13:
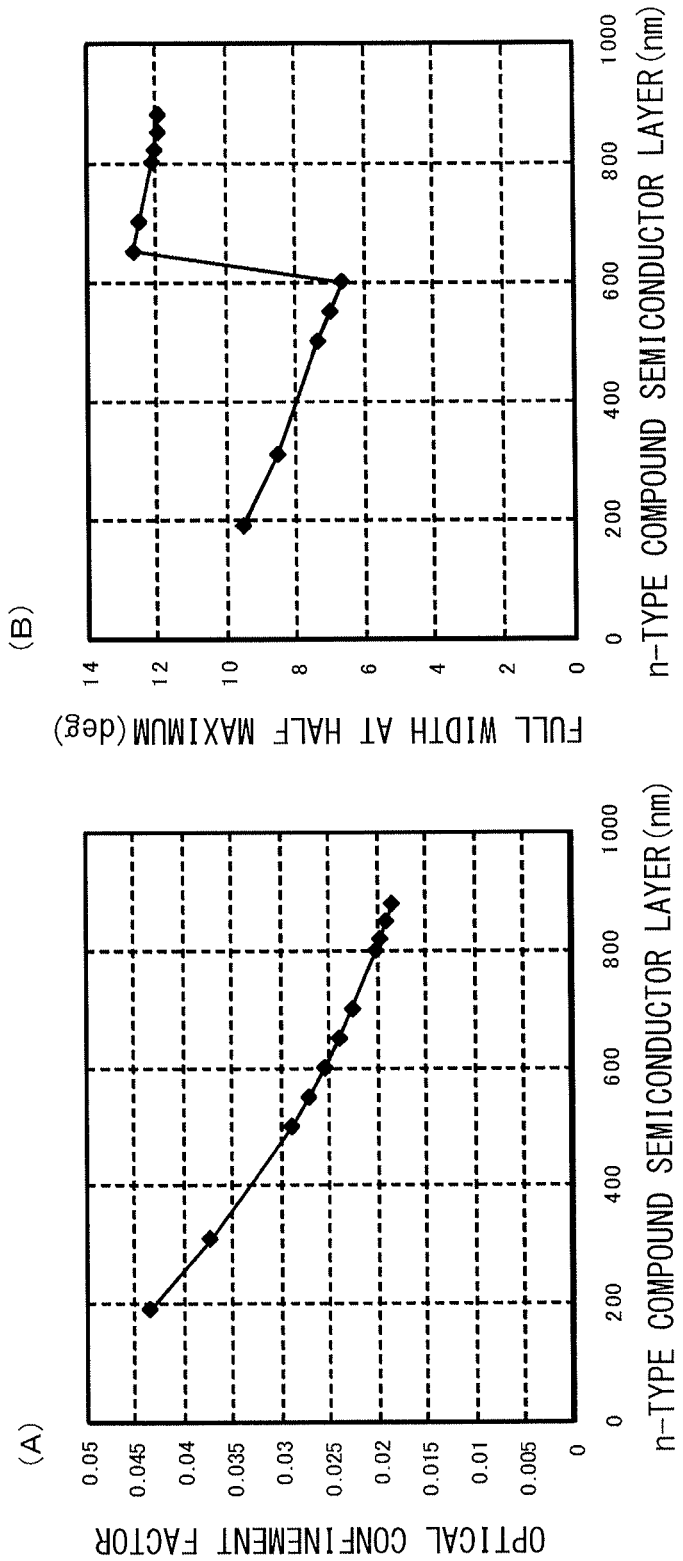
FIGS. 13(A) and (B) are a graph illustrating a relationship between a thickness of an n-type light guide layer configuring a laser diode device or a semiconductor optical amplifier and an optical confinement factor and a graph illustrating a relationship between the thickness of the n-type light guide layer and a full width at half maximum of a far field pattern, respectively.
Figure 14:
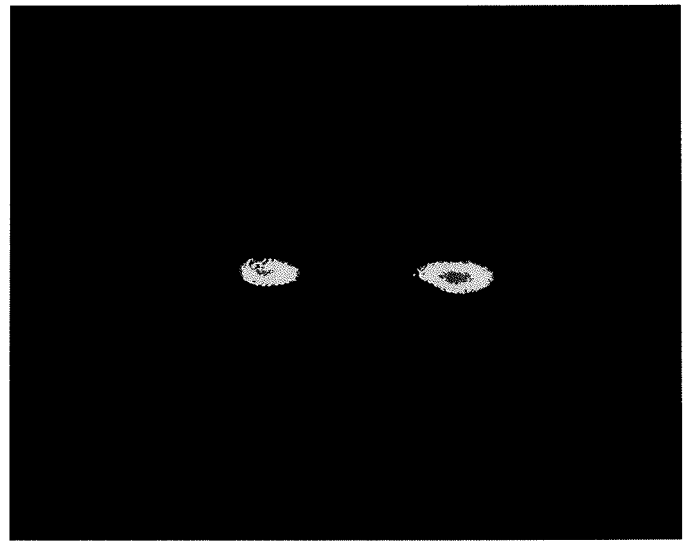
FIG. 14 is a near-field pattern illustrating that, when a thickness of an n-type light guide layer in a laser diode device in related art is greater than 0.6 μm, a light beam is not in a single mode but in a multi-beam shape.

Example 5 is a modification of any of Examples 1 to 4. As illustrated in a schematic partial sectional view in FIG. 12, in a light-emitting device of Example 5, the first compound semiconductor layer 21 has a laminate structure including the first cladding layer 121A and the first guide layers 121b1 and 121b2 in order from the base substrate 20', and a high refractive index layer 29 made of a compound semiconductor material with a higher refractive index than a refractive index of a compound semiconductor material forming the first compound semiconductor layer 21, specifically, the high refractive index layer 29 made of In0.02Ga0.98N with a thickness of 50 nm is formed between the first light guide layers 121b1 and 121b2. A distance from an interface between the active layer 23 and the upper first light guide layer 121b2 to an interface between the upper first light guide layer 121b2 and the high refractive index layer 29 was 0.35 p.m. In this case, $0.01 \leq HR-nG-1 \leq 0.1$ is satisfied, and $nHR \leq nAc$ is satisfied, where the refractive index of the compound semiconductor material forming the first light guide layers $121b_1$ and $121b_2$ is $n_{G-1}$, the refractive index of the compound semiconductor material forming the high refractive index layer 29 is $n_{HR}$, and an average refractive index of the compound semiconductor material forming the active layer 23 is $n_{Ac}$. Specifically, the refractive index $n_{HR}$ was $n_{HR}=2.547$, the refractive index $n_{G-1}$ was $n_{G-1}=2.520$, and the average refractive index $n_{Ac}$ was $n_{Ac}=2.620$.

Although the present disclosure is described referring to preferred examples, the present disclosure is not limited thereto. Configurations and structures of the light-emitting device, the laser diode device, the laser diode unit assembly, the semiconductor optical amplifier, the light output unit, and the laser light source described in the preferred examples are merely examples, and may be modified as appropriate. Moreover, in the examples, various values are indicated, but the values are also examples; therefore, for example, when the specifications of the light-emitting device to be used are changed, the values are also changed. For example, the axis line of the light-emitting device and the axis line of the ridge stripe structure may intersect with each other, or a planar shape of the ridge stripe structure may be a tapered shape.

Moreover, in Example 3, the growth inhibition layer is formed on the top surface of the first portion of the first light guide layer; however, alternatively, two strip-like growth inhibition layers may be formed to allow a region where the first portion of the first light guide layer is supposed to be formed to be sandwiched therebetween.

In the examples, the light-emitting device is disposed on a C plane, i.e., a {0001} plane which is a polar plane of the n-type GaN substrate; however, alternatively, the light-emitting device may be disposed on a nonpolar plane such as an A plane, i.e., a {11-20} plane, an M plane, i.e., a {1-100} plane, or a {1-102} plane, or a semipolar plane such as a {11-2n} plane including a {11-24} plane or a {11-22} plane, a {10-11} plane, or a {10-12} plane, and even if piezopolarization and spontaneous polarization are generated in the active layer of the light-emitting device, piezopolarization is not generated in the thickness direction of the active layer, and piezopolariztaion is generated in a direction substantially perpendicular to the thickness direction of the active layer; therefore, an adverse effect caused by piezopolarization and spontaneous polarization is allowed to be eliminated. It is to be noted that the {11-2n} plane means a nonpolar plane forming an angle of 40 deg with respect to the C plane.

It is to be noted that the present disclosure is allowed to have the following configurations.

[1] (Light-emitting device)
A light-emitting device including:
a laminate structure body configured by laminating, in order, a first compound semiconductor layer of a first conductivity type, an active layer made of a compound semiconductor, and a second compound semiconductor layer of a second conductivity type different from the first conductivity type on a base substrate;
a second electrode formed on the second compound semiconductor layer; and
a first electrode configured to be electrically connected to the first compound semiconductor layer,
in which the first compound semiconductor layer has a laminate structure including a first cladding layer and a first light guide layer in order from the base substrate,
the laminate structure body has a ridge stripe structure configured of the second compound semiconductor layer, the active layer, and a portion in a thickness direction of the first light guide layer, and
$6 \times 10^{-7}$ m $< t_1$ and $0(m) < t_1' \leq 0.5 \cdot t_1$ are satisfied, where a thickness of the first light guide layer is $t_1$, and a thickness of the portion configuring the ridge stripe structure of the first light guide layer is $t_1'$.

[2] The light-emitting device according to [1], in which $t_1 3 \times 10^{-6}$ m is satisfied.

[3] The light-emitting device according to [1] or [2], in which the light-emitting device emits a single-mode light beam.

[4] The light-emitting device according to any one of [1] to [3], in which $0.2 \leq LB_Y/LB_X \leq 1.2$ is satisfied, where a dimension in a width direction of the ridge stripe structure of a light beam emitted from a light-exit end surface of the laminate structure body is $LB_X$, and a dimension in a thickness direction of the ridge stripe structure of the light beam is $LB_Y$.

[5] The light-emitting device according to any one of [1] to [4], in which a distance $Y_{CC}$ from a central point of the active layer in the laminate structure body to a central point of a light beam emitted from the laminate structure body along a thickness direction of the ridge stripe structure in a light-exit end surface of the laminate structure body satisfies $t_1' \leq Y_{CC} \leq t_1$.

[6] The light-emitting device according to any one of [1] to [5], in which the light-emitting device is configured of a laser diode device.

[7] The light-emitting device according to any one of [1] to [5], in which the light-emitting device is configured of a semiconductor optical amplifier.

[8] The light-emitting device according to any one of [1] to [7], in which a high refractive index layer made of a compound semiconductor material with a higher refractive index than a refractive index of a compound semiconductor material forming the first light guide layer is formed in the first light guide layer.

[9] The light-emitting device according to [8], in which $0.01 \leq n_{HR} - n_{G-1} \leq 0.1$ is satisfied, where a refractive index of the compound semiconductor material forming the first light guide layer is $n_{G-1}$, and a refractive index of the compound semiconductor material forming the high refractive index layer is $n_{HR}$.

[10] The light-emitting device according to any one of [1] to [9], in which the second compound semiconductor layer has a laminate structure including a second light guide layer and a second cladding layer in order from the base substrate, and a thickness of the first light guide layer is larger than a thickness of the second light guide layer.

[11] The light-emitting device according to any one of [1] to [10], in which the first compound semiconductor layer, the active layer, and the second compound semiconductor layer are made of a GaN-based compound semiconductor.

[12] (First method of manufacturing a light-emitting device)

A method of manufacturing a light-emitting device, the method including steps of:

after forming a laminate structure body configured by laminating, in order, a first compound semiconductor layer of a first conductivity type, an active layer made of a compound semiconductor, and a second compound semiconductor layer of a second conductivity type different from the first conductivity type on a base substrate, etching the second compound semiconductor layer and the active layer by a dry etching method, and further etching a portion of the first compound semiconductor layer along a thickness direction by the dry etching method to form a ridge stripe structure; and after that, immersing an etched portion in an acid solution or an alkali solution, in which the first compound semiconductor layer has a laminate structure including a first cladding layer and a first light guide layer in order from the base substrate, the ridge stripe structure is configured of the second compound semiconductor layer, the active layer, and a portion in the thickness direction of the first light guide layer, and $6 \times 10^{-7}$ m $< t_1$ and $0(m) < t_1' \leq 0.5 \cdot t_1$ are satisfied, where a thickness of the first light guide layer is $t_1$, and a thickness of the portion configuring the ridge stripe structure of the first light guide layer is $t_1'$.

[13] (Second method of manufacturing a light-emitting device)

A method of manufacturing a light-emitting device, the method including steps of:

forming, on a base substrate, two recess sections extending along an axis line direction of a light-emitting device that is supposed to be manufactured to obtain a region sandwiched between the two recess sections of the base substrate; and after that, forming a laminate structure body configured by laminating, in order, a first compound semiconductor layer of a first conductivity type, an active layer made of a compound semiconductor, and a second compound semiconductor layer of a second conductivity type different from the first conductivity type on the base substrate, in which the first compound semiconductor layer has a laminate structure including a first cladding layer and a first light guide layer in order from the base substrate, $6 \times 10^{-7}$ m $< t_1$ and $(T_{Total} - 0.5 \cdot t_1) \leq D \leq T_{Total}$ are satisfied, where a thickness of the first light guide layer on the region sandwiched between the two recess sections of the base substrate is $t_1$, a total thickness of the laminate structure body is $t_{Total}$, and a depth of the recess section is D.

[14] (Third method of manufacturing a light-emitting device)

A method of manufacturing a light-emitting device, the method including steps of:

after forming a first portion of a first compound semiconductor layer of a first conductivity type, forming a growth inhibition layer on the first portion of the first compound semiconductor layer to allow a region where a ridge stripe structure is supposed to be formed of the first portion of the first compound semiconductor layer to be exposed; and after that, forming a laminate structure body configured by laminating, in order, a second portion of the first compound semiconductor layer, an active layer made of a compound semiconductor, and a second compound semiconductor layer of a second conductivity type different from the first conductivity type on a region exposed from a bottom of an opening of the first portion of the first compound semiconductor layer, in which the first portion of the first compound semiconductor layer has a laminate structure including a first cladding layer and a first portion of a first light guide layer in order from the base substrate, and a second portion of the first compound semiconductor layer is configured of a second portion of the first light guide layer, and $6 \times 10^{-7}$ m $< t_1$ and $0(m) < t_1' \leq 0.5 \cdot t_1$ are satisfied, where a total of thicknesses of the first portion of the first light guide layer and the second portion of the first light guide layer is $t_1$, and a thickness of the second portion of the first light guide layer is $t_1'$.

[15] The method of manufacturing the light-emitting device according to [14], in which the growth inhibition layer is configured of a material layer of one or more kinds selected from a group configured of $SiO_2$, $Al_2O_3$, MN, $ZrO_2$, $Ta_2O_5$, and AlGaInN.

[16] The method of manufacturing the light-emitting device according to any one of [12] to [15], in which a high refractive index layer made of a compound semiconductor material with a higher refractive index than a refractive index of a compound semiconductor material forming the first light guide layer is formed in the first light guide layer.

[17] The method of manufacturing the light-emitting device according to [16], in which $0.01 \leq n_{HR} - n_{G-1} \leq 0.1$ is satisfied, where a refractive index of the compound semiconductor material forming the first light guide layer is $n_{G-1}$, and a refractive index of the compound semiconductor material forming the high refractive index layer is $n_{HR}$.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A light-emitting device comprising:
   a laminate structure body configured by laminating, in order, a first compound semiconductor layer of a first conductivity type, an active layer made of a compound semiconductor, and a second compound semiconductor layer of a second conductivity type different from the first conductivity type on a base substrate;
   a second electrode formed on the second compound semiconductor layer; and
   a first electrode configured to be electrically connected to the first compound semiconductor layer,
   wherein the first compound semiconductor layer has a laminate structure including a first cladding layer and a first light guide layer in order from the base substrate,
   the laminate structure body has a ridge stripe structure configured of the second compound semiconductor layer, the active layer, and a portion in a thickness direction of the first light guide layer, and
   $6 \times 10^{-7}$ m $< t_1$ and $0(m) < t_1' \leq 0.5 \cdot t_1$ are satisfied, where a thickness of the first light guide layer is $t_1$, and a thickness of the portion configuring the ridge stripe structure of the first light guide layer is $t_1'$.

2. The light-emitting device according to claim 1, wherein $t_1 \leq 3 \times 10^{-6}$ m is satisfied.

3. The light-emitting device according to claim 1, wherein the light-emitting device emits a single-mode light beam.

4. The light-emitting device according to claim 1, wherein $0.2 \leq LB_Y/LB_X \leq 1.2$ is satisfied, where a dimension in a width direction of the ridge stripe structure of a light beam emitted from a light-exit end surface of the laminate structure body is $LB_X$, and a dimension in a thickness direction of the ridge stripe structure of the light beam is $LB_Y$.

5. The light-emitting device according to claim 1, wherein a distance $Y_{CC}$ from a central point of the active layer in the laminate structure body to a central point of a light beam emitted from the laminate structure body along a thickness direction of the ridge stripe structure in a light-exit end surface of the laminate structure body satisfies $t_1' \leq Y_{CC} \leq t_1$.

6. The light-emitting device according to claim 1, wherein the light-emitting device is configured of a laser diode device.

7. The light-emitting device according to claim 1, wherein the light-emitting device is configured of a semiconductor optical amplifier.

8. The light-emitting device according to claim 1, wherein a high refractive index layer made of a compound semiconductor material with a higher refractive index than a refractive index of a compound semiconductor material forming the first light guide layer is formed in the first light guide layer.

9. The light-emitting device according to claim 8, wherein $0.01 \leq n_{HR} - n_{G-1} \leq 0.1$ is satisfied, where a refractive index of the compound semiconductor material forming the first light guide layer is $n_{G-1}$, and a refractive index of the compound semiconductor material forming the high refractive index layer is $n_{HR}$.

10. The light-emitting device according to claim 1, wherein the second compound semiconductor layer has a laminate structure including a second light guide layer and a second cladding layer in order from the base substrate, and
    a thickness of the first light guide layer is larger than a thickness of the second light guide layer.

11. The light-emitting device according to claim 1, wherein the first compound semiconductor layer, the active layer, and the second compound semiconductor layer are made of a GaN-based compound semiconductor.

12. A method of manufacturing a light-emitting device, the method comprising steps of:
    after forming a laminate structure body configured by laminating, in order, a first compound semiconductor layer of a first conductivity type, an active layer made of a compound semiconductor, and a second compound semiconductor layer of a second conductivity type different from the first conductivity type on a base substrate, etching the second compound semiconductor layer and the active layer by a dry etching method, and further etching a portion of the first compound semiconductor layer along a thickness direction by the dry etching method to form a ridge stripe structure; and
    after that, immersing an etched portion in an acid solution or an alkali solution,
    wherein the first compound semiconductor layer has a laminate structure including a first cladding layer and a first light guide layer in order from the base substrate,
    the ridge stripe structure is configured of the second compound semiconductor layer, the active layer, and a portion in the thickness direction of the first light guide layer, and
    $6 \times 10^{-7}$ m $< t_1$ and $0(m) < t_1' \leq 0.5 \cdot t_1$ are satisfied, where a thickness of the first light guide layer is $t_1$, and a thickness of the portion configuring the ridge stripe structure of the first light guide layer is $t_1'$.

13. A method of manufacturing a light-emitting device, the method comprising steps of:
    forming, on a base substrate, two recess sections extending along an axis line direction of a light-emitting device that is supposed to be manufactured to obtain a region sandwiched between the two recess sections of the base substrate; and
    after that, forming a laminate structure body configured by laminating, in order, a first compound semiconductor layer of a first conductivity type, an active layer made of a compound semiconductor, and a second compound semiconductor layer of a second conductivity type different from the first conductivity type on the base substrate,
    wherein the first compound semiconductor layer has a laminate structure including a first cladding layer and a first light guide layer in order from the base substrate,
    $6 \times 10^{-7}$ m $< t_1$ and $(t_{Total} - 0.5\ t_1) \leq D \leq t_{Total}$ are satisfied, where a thickness of the first light guide layer on the region sandwiched between the two recess sections of the base substrate is $t_1$, a total thickness of the laminate structure body is $t_{Total}$, and a depth of the recess section is D.

14. A method of manufacturing a light-emitting device, the method comprising steps of:
    after forming a first portion of a first compound semiconductor layer of a first conductivity type, forming a growth inhibition layer on the first portion of the first compound semiconductor layer to allow a region where a ridge stripe structure is supposed to be formed of the first portion of the first compound semiconductor layer to be exposed; and
    after that, forming a laminate structure body configured by laminating, in order, a second portion of the first compound semiconductor layer, an active layer made of a compound semiconductor, and a second compound semiconductor layer of a second conductivity type different from the first conductivity type on a region exposed from a bottom of an opening of the first portion of the first compound semiconductor layer,
    wherein the first portion of the first compound semiconductor layer has a laminate structure including a first cladding layer and a first portion of a first light guide layer in order from the base substrate, and a second portion of the first compound semiconductor layer is configured of a second portion of the first light guide layer, and $6\times10^{-7}$ m $< t_1$ and $0(m) < t_1' \leq 0.5 \cdot t_1$ are satisfied, where a total of thicknesses of the first portion of the first light guide layer and the second portion of the first light guide layer is $t_1$, and a thickness of the second portion of the first light guide layer is $t_1'$.

15. The method of manufacturing the light-emitting device according to claim 14, wherein the growth inhibition layer is configured of a material layer of one or more kinds selected from a group consisting of $SiO_2$, $Al_2O_3$, AlN, $ZrO_2$, $Ta_2O_5$, and AlGaInN.

16. The method of manufacturing the light-emitting device according to claim 12, wherein a high refractive index layer made of a compound semiconductor material with a higher refractive index than a refractive index of a compound semiconductor material forming the first light guide layer is formed in the first light guide layer.

17. The method of manufacturing the light-emitting device according to claim 16, wherein $0.01 \leq n_{HR} - n_{G-1} \leq 0.1$ is satisfied, where a refractive index of the compound semiconductor material forming the first light guide layer is $n_{G-1}$, and a refractive index of the compound semiconductor material forming the high refractive index layer is $n_{HR}$.

* * * * *